(12) United States Patent
Tanaka et al.

(10) Patent No.: US 10,361,324 B2
(45) Date of Patent: Jul. 23, 2019

(54) THIN-FILM STRUCTURAL BODY, METHOD FOR MANUFACTURING THIN-FILM STRUCTURAL BODY, AND SEMICONDUCTOR DEVICE

(71) Applicant: Murata Manufacturing Co., Ltd., Nagaokakyo-shi, Kyoto-fu (JP)

(72) Inventors: Hidekazu Tanaka, Nagaokakyo (JP); Osamu Nakagawara, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 97 days.

(21) Appl. No.: 15/661,225

(22) Filed: Jul. 27, 2017

(65) Prior Publication Data
US 2017/0338358 A1     Nov. 23, 2017

Related U.S. Application Data

(63) Continuation of application No. PCT/JP2016/056793, filed on Mar. 4, 2016.

(30) Foreign Application Priority Data

Mar. 24, 2015 (JP) ................. 2015-060978

(51) Int. Cl.
*B82Y 20/00* (2011.01)
*B82Y 30/00* (2011.01)
(Continued)

(52) U.S. Cl.
CPC ........ *H01L 31/03529* (2013.01); *C23C 14/08* (2013.01); *C23C 14/28* (2013.01); *C30B 23/025* (2013.01); *C30B 29/16* (2013.01); *H01L 31/0296* (2013.01); *H01L 31/032* (2013.01); *H01L 31/0328* (2013.01); *H01L 31/0352* (2013.01); *H01L 31/035227* (2013.01);
(Continued)

(58) Field of Classification Search
None
See application file for complete search history.

(56) References Cited

U.S. PATENT DOCUMENTS

| 2012/0192936 A1 | 8/2012 | Girt et al. |
| 2013/0037740 A1 | 2/2013 | Wakayama et al. |
| 2015/0376071 A1 | 12/2015 | Wakayama et al. |

FOREIGN PATENT DOCUMENTS

| JP | S50-158290 A | 12/1975 |
| JP | 2003-258278 A | 9/2003 |

(Continued)

OTHER PUBLICATIONS

International Search Report issued in International Application No. PCT/JP2016/056793, dated Jun. 7, 2016.
(Continued)

*Primary Examiner* — Shannon M Gardner
(74) *Attorney, Agent, or Firm* — Arent Fox LLP

(57) ABSTRACT

A structural body that includes a film that has a phase-separated nanostructure where a separate columnar shape phase is dispersed in a matrix phase that are phase-separated in a state of thermal equilibrium. The matrix phase is formed from any one of a p-type semiconductor material and an n-type semiconductor material, and the separate columnar shape phase is formed from the other semiconductor material. The film is formed on a substrate such that the separate columnar shaped phase and the matrix phase have three-dimensional junction planes.

20 Claims, 17 Drawing Sheets

(51) Int. Cl.
*B82Y 40/00* (2011.01)
*C23C 14/08* (2006.01)
*C23C 14/28* (2006.01)
*C30B 29/16* (2006.01)
*H01L 31/18* (2006.01)
*H01L 31/032* (2006.01)
*H01L 31/072* (2012.01)
*H01L 31/0296* (2006.01)
*H01L 31/0328* (2006.01)
*H01L 31/0352* (2006.01)
*C30B 23/02* (2006.01)

(52) U.S. Cl.
CPC ............ *H01L 31/072* (2013.01); *H01L 31/18* (2013.01); *B82Y 20/00* (2013.01); *B82Y 30/00* (2013.01); *B82Y 40/00* (2013.01); *Y10S 977/811* (2013.01); *Y10S 977/895* (2013.01); *Y10S 977/948* (2013.01)

(56) References Cited

FOREIGN PATENT DOCUMENTS

| | | |
|---|---|---|
| JP | 2010-49741 A | 3/2010 |
| JP | 2011-35243 A | 2/2011 |
| JP | 2013-65664 A | 4/2013 |
| WO | WO 2011/115165 A1 | 9/2011 |

OTHER PUBLICATIONS

Macmanus-Driscoll et al., "Strain control and spontaneous phase ordering in vertical nanocomposite heteroepitaxial thin films," Nature Materials, vol. 7, Apr. 2008, pp. 314-320.

Mohaddes-Ardabili et al., "Self-assembled single-crystal ferromagnetic iron nanowires formed by decomposition," Nature Materials, vol. 3, Aug. 2004, pp. 533-538.

Warasawa et al., "Fabrication of Visible-Light Transparent Solar Cells Using p-Type NiO Films by Low Oxygen Fraction Reactive RF sputtering Deposition," Japanese Journal of Applied Physics, vol. 52, pp. 1-3.

Written Opinion of the International Searching Authority issued in International Application No. PCT/JP2016/056793, dated Jun. 7, 2016.

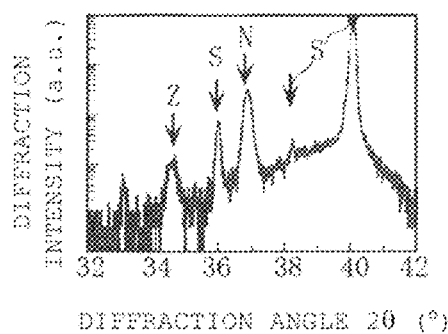
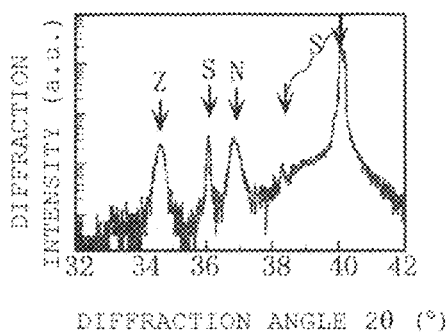
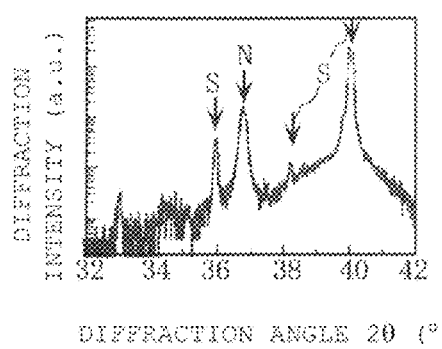
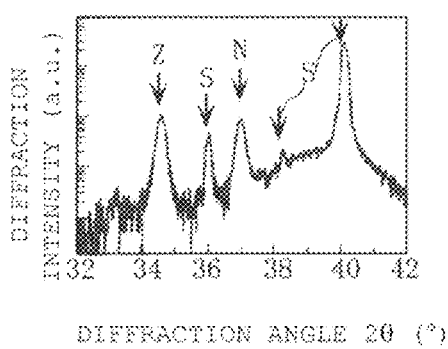
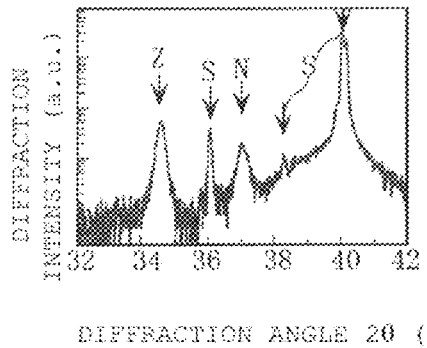
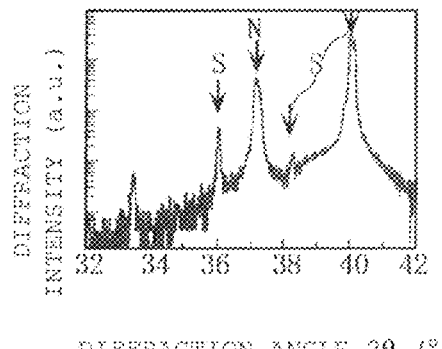
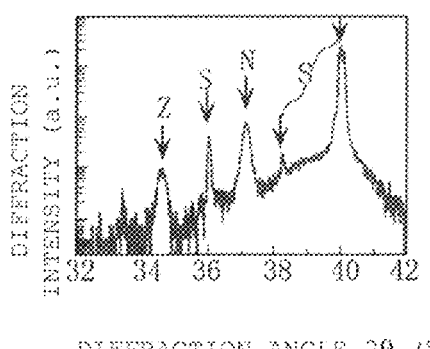

FIG. 17(a)
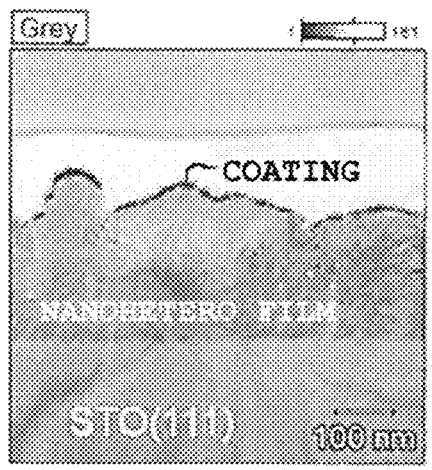
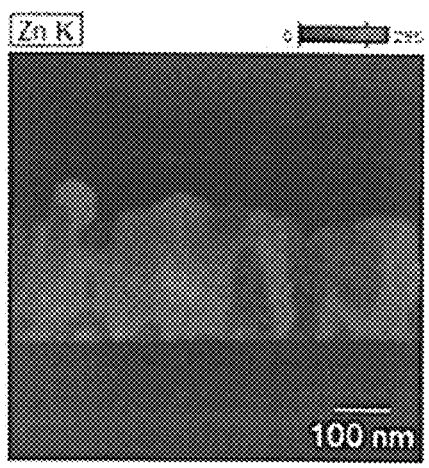
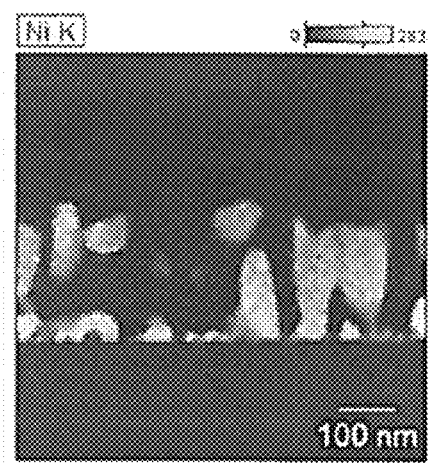
FIG. 17(b)
FIG. 17(c)

THIN-FILM STRUCTURAL BODY, METHOD FOR MANUFACTURING THIN-FILM STRUCTURAL BODY, AND SEMICONDUCTOR DEVICE

CROSS REFERENCE TO RELATED APPLICATIONS

The present application is a continuation of International application No. PCT/JP2016/056793, filed Mar. 4, 2016, which claims priority to Japanese Patent Application No. 2015-060978, filed Mar. 24, 2015, the entire contents of each of which are incorporated herein by reference.

FIELD OF THE INVENTION

The present invention relates to a thin-film structural body and a method for manufacturing a thin-film structural body, and a semiconductor device, and more particularly, to a thin-film structural body that has a phase-separated nanostructure of separate phases dispersed in a matrix phase, and a method for manufacturing the thin-film structural body, and a semiconductor device that uses the thin-film structural body, such as a solar cell.

BACKGROUND OF THE INVENTION

Nanoparticles of ultrafine particles down to nanometer ($10^{-9}$ m) ranges from substances can produce various unique properties which are not provided by any bulk material, and thus have been attracting particular attention in combination with dramatic progress of nanostructure evaluation technology.

Among the foregoing nanostructures, thin-film structural bodies that have phase-separated nanostructures of separate phases dispersed in matrix phases have also been actively studied, for use as novel functional materials.

For example, Non-Patent Document 1 reports therein strain control and a spontaneously formed phase order in heteroepitaxial thin films of vertical nanostructures.

According to Non-Patent Document 1, with the use of a mixture of $La_{0.7}Sr_{0.3}MnO_3$ (LSMO) and ZnO, heteroepitaxial growth by self-organization is induced on a $SrTiO_3$ substrate, thereby forming a thin film that has a phase-separated nanostructure of ZnO as a matrix phase and LSMO as a columnar separate phase. Likewise, a fixture of $BiFeO_3$ and $Sm_2O_3$ is used to form a thin film of $Sm_2O_3$ as a matrix phase and $BiFeO_3$ as a separate phase on a $SrTiO_3$ substrate.

More specifically, according to Non-Patent Document 1, the spontaneous formation of phase orders with the use of the magnetic materials provides heteroepitaxial films of vertical nanostructures on the $SrTiO_3$ substrates. Non-Patent Document 1 discusses therein interface strain at the junction interfaces between the matrix phases and the separate phases, and reports that vertical strain is controlled by the strain state in a thin film in excess of 20 nm in thickness.

In addition, Non-Patent Document 2 reports a self-organization single-crystal ferromagnetic iron nanowire formed by decomposition.

According to Non-Patent Document 2, with the use of $La_{0.5}Sr_{0.5}FeO_3$ as a target substance, the target substance is irradiated with a pulsed laser while heating a single crystal $SrTiO_3$ (001) substrate to 760° C. under high vacuum, thereby decomposing $La_{0.5}Sr_{0.5}FeO_3$ into $LaSrFeO_4$ and Fe, and thus providing a nanostructure that has a self-organized vertical α-Fe nanowire embedded in a $LaSrFeO_4$ matrix.

Further, Non-Patent Document 2 reports therein that the prepared α-Fe nanowire has strong magnetic anisotropy, and differs in magnetic property depending on the growth orientation of epitaxial film.

On the other hand, in recent years, from the perspective of reduction of global environmental burden, attempts to use natural energy have been also actively made, and in combination with the progress of semiconductor technology, solar cells have been also actively researched and developed with the use of the semiconductor technology.

For example, Non-Patent Document 3 reports therein the preparation of a visible-light transmission solar cell with the use of a p-type NiO film obtained by a low-oxygen partial pressure reactive RF sputtering deposition method.

According to Non-Patent Document 3, under an extremely low oxygen partial pressure at which the proportion of $O_2$ to the total of Ar and $O_2$ is 0.5%, the p-type NiO film with a light transmission in excess of 80% in the wavelength range of 500 to 800 nm is obtained by the reactive RF sputtering. Further, it is reported therein that when an n-type ZnO layer was stacked on the p-type NiO layer to prepare a solar cell with a p-n junction, a clear photoelectric effect was observed, although the effect was slight.

Non-Patent Document 1: J. L. MacManus-Driscoll et al., "Strain control and spontaneous phase ordering in vertical nanocomposite heteroepitaxial thin film", Nature Material, Vol. 7, April 2008, pp. 314-320

Non-Patent Document 2: L. Mohaddes-Ardabili et al., "Self-assembled single-crystal ferromagnetic iron nanowires formed by decomposition", Nature Material, Vol. 3, August 2004, pp. 533-538

Non-Patent Document 3: M. Warasawa et al., "Fabrication of Visible-Light-Transport Solar Cells Using p-Type NiO Films by Low Oxygen Fraction Reactive RF Sputtering Deposition", Japanese Journal of Applied Physics, 52 (2013), pp. 021102-1-021102-4

SUMMARY OF THE INVENTION

Semiconductor devices to which the semiconductor technology is applied are widely used in various fields, such as various types of light emitting devices, e.g., light emitting diodes (LED) and semiconductor lasers, and various types of sensors such as ultraviolet sensors and gas sensors, besides the solar cells mentioned above.

In addition, if thin-film structural bodies that have phase-separated nanostructures as described above can be achieved with the use of respective p-type and n-type semiconductor materials, it is considered possible to achieve various types of higher-performance/higher-quality semiconductor devices.

However, according to Non-Patent Documents 1 and 2, magnetic materials are used to form thin films which have phase-separated nanostructures, and the contents of these documents also discuss the resulting interface strain and magnetic anisotropy. These documents, however, do not discuss the ability to obtain any p-n-junction with the use of respective p-type and n-type semiconductor materials, and fail to make reference to any application to semiconductor devices.

In addition, according to Non-Patent Document 3, the solar cell is formed by stacking the n-type ZnO layer on the p-type NiO layer, but the energy conversion efficiency from light energy into electrical energy is extremely low because the interface of the p-n junction is two-dimensionally formed, and it is therefore difficult to obtain a solar cell that has a high-efficiency energy conversion efficiency.

The present invention has been achieved in view of these circumstances, and an object of the invention is to provide a high-performance/high-quality and highly reliable thin-film structural body, and a method for manufacturing the thin-film structure, and various types of semiconductor devices such as a solar cell that uses the thin-film structural body.

In order to achieve the object mentioned above, a thin-film structural body according to the present invention includes a thin film that has a phase-separated nanostructure where a separate columnar shaped phase is dispersed in a matrix phase that are phase-separated in a state of thermal equilibrium. The matrix phase is formed from any one of a p-type semiconductor material and an n-type semiconductor material, whereas the separate columnar shaped phase is formed from the other semiconductor material. The thin film is formed on a substrate such that the separate columnar shaped phase and the matrix phase have a three-dimensional junction plane. As one of skill in the art would appreciate, the columnar shaped phase can take many forms such as cylindrical, conical, tetrahedral, pyramidal, cuboidal, triangular, or the like.

Thus, the area of contact at the junction interface of the p-n junction can be increased as compared with two-dimensional laminated structures of p-type semiconductor layers and n-type semiconductor layers laminated, and a high-performance/high-quality thin-film structural body can be achieved which is applicable to high-efficiency energy conversion devices and various types of high-sensitivity sensors. In addition, the p-type semiconductor material and the n-type semiconductor material are phase-separated in a state of thermal equilibrium, thus making it possible to maintain stable performance even during thermal loading, and allowing for the achievement of a highly reliable thin-film structural body.

In addition, for the thin-film structural body according to the present invention, the substrate preferably is a material selected on the basis of the degrees of lattice mismatch with the p-type semiconductor material and the n-type semiconductor material.

Thus, the p-type semiconductor material and the n-type can each be obtained by crystal growth in accordance with a crystal growth mode depending on the degree of lattice mismatch.

In addition, for the thin-film structural body according no the present invention, the three-dimensional junction plane is preferably formed through crystal growth by self-organization.

Thus, the thin film forms the three-dimensional junction plane while forming a spontaneous phase order, thereby making it possible to obtain a thin-film structural, body capable of achieving a high-capacity semiconductor device that has a large junction area.

In addition, for the thin-film structural body according to the present invention, the thin film is preferably formed by epitaxial growth on the substrate.

The formation of the thin film by epitaxial growth as just described can suppress the generation of defects and crystal grain boundaries in the thin film.

In addition, in the thin-film structural body according to the present invention, crystal grains of the thin film are preferably triaxially oriented.

Thus, a highly oriented film can be obtained which is oriented in all of the crystal orientations of crystal axes, and a high-quality thin-film structural body can be obtained which has functionality improved.

In addition, for the thin-film structural body according to the present invention, the thin film is preferably deposited on the substrate by a pulsed laser deposition method.

The pulsed laser deposition can manufacture a desired thin-film structural body in a simple and inexpensive manner, with a high degree of freedom for deposition conditions, because appropriate deposition conditions (substrate temperature, deposition atmosphere, etc.) can be set freely for a target substance.

In addition, in the thin-film structural body according to the present invention, the p-type semiconductor material preferably includes an oxide containing, as its main constituent, any one selected from the group of NiO, $Cu_2O$, CuO, and CoO.

Furthermore, in the thin-film structural body according to the present invention, the n-type semiconductor material preferably includes an oxide containing, as its main constituent, any one selected from the group of ZnO, $TiO_2$, $Fe_3O_4$, $Fe_2O_3$, MnO, and an indium tin oxide.

In addition, in the thin-film structural body according to the present invention, the substrate is preferably formed from a single-crystal material containing, as its main constituent, any one selected from the group of $SrTiO_3$, ZnO, MgO, $ScAlMgO_3$, $Al_2O_3$, GaN, $LiNbO_3$, and $LiTaO_3$.

In addition, for the thin-film structural body according to the present invention, the matrix phase and the substrate are preferably formed from materials containing different main constituents.

In this case, on the substrate, the matrix phase can be obtained by crystal growth through heteroepitaxial growth.

In addition, for the thin-film structural body according to the present invention, the matrix phase and the substrate are also preferably formed from materials containing the same main constituent.

In this case, on the substrate, the matrix phase is allowed to be formed by homoepitaxial growth, thus making is possible to obtain a matrix phase with more favorable crystallinity.

Furthermore, a method for manufacturing a thin-film structural body according to the present invention includes: preparing a p-type semiconductor material and an n-type semiconductor material that are phase-separated in a state of thermal equilibrium; and forming a film having a phase-separated nanostructure on a substrate by three-dimensional crystal growth while separating the p-type semiconductor material and the n-type semiconductor material each into monolayers by self-organization on the substrate so as to form a matrix phase from any one of the p-type semiconductor material and the n-type semiconductor material and a separate columnar shaped phase from the other of the p-type semiconductor material and the n-type semiconductor material, and the separate columnar shaped phase is dispersed in the matrix phase.

Thus, a highly reliable high-capacity thin-film structural body can be manufactured which has a large area of contact at the junction interfaces of the p-n junctions, and allows stable performance to be maintained even during thermal loading.

In addition, in the method for manufacturing a thin-film structural body according to the present invention, the crystal growth is preferably achieved by epitaxial growth.

Thus, the generation of defects and crystal grain boundaries in the thin film can be suppressed, thereby manufacturing a dense high-quality thin-film structural body including a highly oriented film with crystal grains triaxially oriented.

Furthermore, in the method for manufacturing a thin-film structural body according to the present invention, preferably, a mixture of the p-type semiconductor material and the n-type semiconductor material is disposed as a target substance opposed to the substrate in a deposition chamber, and the thin film through three-dimensional crystal growth is deposited on the substrate by heating the substrate and inducing ablation through irradiation of the mixture with a pulsed laser from the outside of the deposition chamber and under a reduced-pressure atmosphere.

Thus, the degree of freedom for setting deposition conditions such as the substrate temperature and the atmosphere in the deposition chamber is allowed to be increased, because the laser oscillator to serve as a laser light source is disposed outside the deposition chamber. In addition, the adoption of the single mixture as the target substance can avoid an increase in deposition system size and complicated deposition conditions, without the need to adopt multiple materials as the target substance, thereby manufacturing a thin-film structural body in a simple and inexpensive manner.

In addition, in the method for manufacturing a thin-film structural body according to the present invention, the epitaxial growth preferably has heteroepitaxial growth.

The heteroepitaxial growth with the use of mutually different types of semiconductor materials that differ from the substrate material as just described can easily achieve a thin-film structural body that has a nanostructure where a separate columnar shaped phase and a matrix phase are phase-separated.

Furthermore, in the method for manufacturing a thin-film structural body according to the present invention, the epitaxial growth preferably has homoepitaxial growth for one semiconductor material that forms the matrix phase, and heteroepitaxial growth for the other semiconductor material that forms the separate columnar shaped phase.

In this case, the matrix phase is formed by homoepitaxial growth, thus making it possible to obtain a matrix phase with more favorable crystallinity.

In addition, a semiconductor device according to the present invention is characterized in that the device has the thin-film structural body described above.

Thus, the large area of contact at the junction interface of the p-n junction makes it possible to generate carrier in large amounts, and thus allows for the achievement of various types of high-performance/high-quality and highly reliable semiconductor devices.

BRIEF EXPLANATION OF THE DRAWINGS

FIGS. 11(a) to 11(g) show low-angle X-ray diffraction profiles for each of samples prepared according to an example.

FIGS. 17(a) to 17(c) show a TEM image of and mapping images of a part A in FIG. 16.

DETAILED DESCRIPTION OF PREFERRED EMBODIMENTS OF THE INVENTION

Next, embodiments of the present invention will be described in detail.

Figure 1:
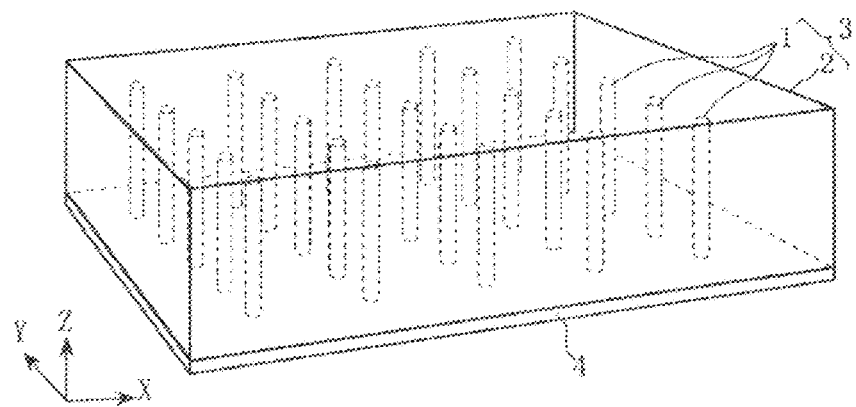
FIG. 1 is a perspective view schematically illustrating an embodiment of a thin-film structural body according to the present invention.
Figure 2:
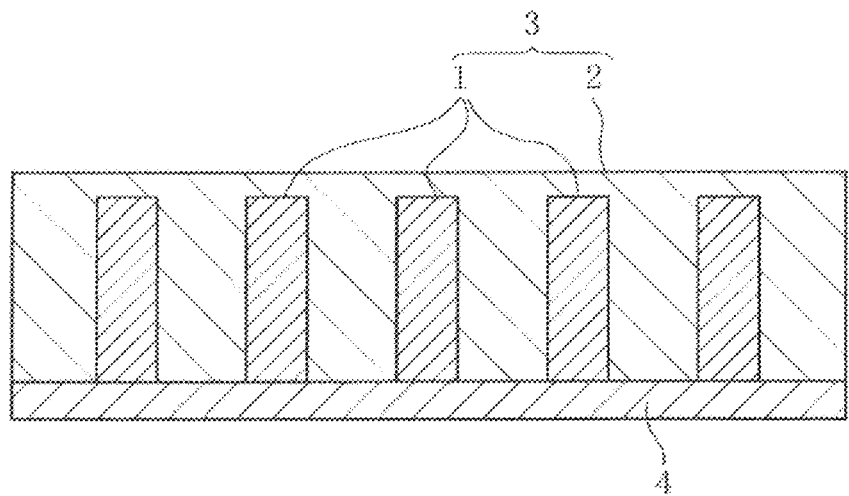
FIG. 2 is a longitudinal cross-sectional view of FIG. 1.

FIG. 1 is a perspective view schematically illustrating an embodiment of a thin-film structural body according to the present invention, and FIG. 2 is a longitudinal cross-sectional view of FIG. 1.

This thin-film structural body has a phase-separated nanostructure where a plurality of separate phases (hereinafter, referred to as "pillars") 1 formed in a columnar shape are dispersed in a matrix phase (hereinafter, referred to as a "matrix") 2, the pillars 1 and the matrix 2 form a thin film 3, and the thin film 3 is formed on a substrate 4.

Specifically, the thin film 3 has a p-type semiconductor material and an n-type semiconductor material that are phase-separated in a state of thermal equilibrium. Further, the matrix 2 is formed from any one of the p-type semiconductor material and the n-type semiconductor material, and the pillars 1 are formed from the other semiconductor material. More specifically, the pillars 1 are formed from the n-type semiconductor material when the matrix 2 is formed from the p-type semiconductor material, whereas the pillars 1 are formed from the p-type semiconductor material when the matrix 2 is formed from the n-type semiconductor material, and the matrix 2 and the pillars 1 thus form p-n junctions.

In addition, the thin film 3 is formed on the substrate 4 such that the pillars 1 and the matrix 2 have three-dimensional junction planes. More specifically, the thin film 3 is formed on the substrate 4 such that the pillars 1 and the matrix 2 have junction planes with respect to the three directions of X direction, Y direction, and Z direction, with the pillars 1 coated with the matrix 2, unlike such two-dimensional structures as in Non-Patent Document 3 described above.

As just described, the present thin-film structural body is configured such that the pillars 1 and the matrix 2 have three-dimensional junction planes, thus making it possible to increase the area of contact, at the junction interfaces as compared with two-dimensional laminated structures, and making it possible to obtain a thin-film structural body preferred for the achievement of high-efficiency energy conversion devices and various types of high-sensitivity sensors and the like. In addition, the p-type semiconductor material and the n-type semiconductor material are phase-separated in a state of thermal equilibrium, thus making it possible to maintain the phase-separated nanostructure stable even during thermal loading, and making it possible to obtain a thin-film structural body which has high reliability against thermal loading.

These p-type semiconductor material and the n-type semiconductor material are not to be considered particularly limited as long as the materials are phase-separated from each other without forming any solid solution in a state of thermal equilibrium. For example, an oxide containing, as its main constituent, any one selected from the group of NiO, $Cu_2O$, CuO, and CoO can be used as the p-type semiconductor material. In addition, an oxide containing, as its main constituent, one selected from the group of ZnO, $TiO_2$, $Fe_3O_4$, $Fe_2O_3$, MnO, and an ITO (indium tin oxide) can be used as the n-type semiconductor material. Further, these p-type semiconductor material and n-type semiconductor material can be combined to form the pillars 1 and the matrix 2. The p-type semiconductor material and the n-type semiconductor material may contain therein minute amounts of impurities that ace as minority carriers.

In addition, the three-dimensional junction plane is preferably formed through crystal growth by self-organization. This crystal growth by self-organization results in crystal growth while spontaneously forming a phase order, thus making it possible to obtain a thin-film structural body which has a larger junction area, and allowing for the achievement of various types of high-capacity semiconductor devices.

In addition, for the present thin-film structural body, the thin film 3 is preferably formed on the substrate 4 by epitaxial growth, thereby making it possible to suppress the generation of defects and crystal grain boundaries in the thin film 3, and thus making it possible to obtain a dense high-quality thin-film structural body.

Furthermore, for the present thin-film structural body, crystal grains of the thin film are preferably triaxially oriented, thereby making it possible to obtain a high-quality thin-film structural body including a highly oriented film with functionality improved. It is to be noted that as is clear from an example as will be described later, the formation of the thin film 3 by crystal growth through epitaxial growth by self-organization allows for not only uniaxial orientation in a direction perpendicular to the plane, but also biaxial orientation in in-plane directions, thereby making it possible for the crystal particles to be triaxially oriented.

In addition, the substrate material for use in the substrate 4 is not to be considered particularly limited as long as it is possible to form, on the substrate A, the thin film 3 that has a pillar/matrix nanostructure including three-dimensional junction planes, but it is preferable to form the thin film 3 by epitaxial growth of the p-type semiconductor material and the n-type semiconductor material on the substrate, in order for the thin film 3 to have high orientation as described above. From the foregoing perspective, for example, hexagonal single crystals such as $Al_2O_3$, $LiNbO_3$, $ScAlMgO_4$, 6H—SiC, GaN, and ZnO; trigonal single crystals such as $LiTaO_3$; or cubic single crystals such as $SrTiO_3$, MgO, and ZnO can be used by choice as a main constituent.

Further, the substrate material is preferably selected on the basis of the degrees of lattice mismatch with the p-type semiconductor material and the n-type semiconductor material.

The relationship between the epitaxial growth and the degree of lattice mismatch will be described in detail below.

Figure 3A:
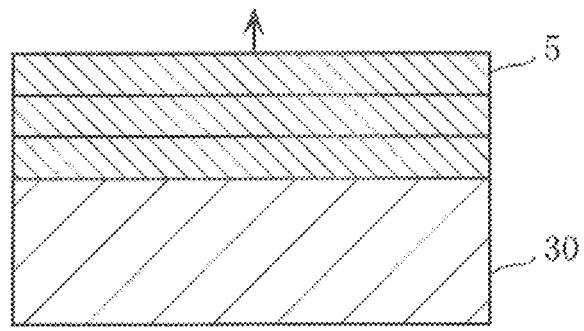
FIGS. 3(a) to 3(c) are diagrams explaining crystal growth modes for epitaxial growth.
Figure 3B:
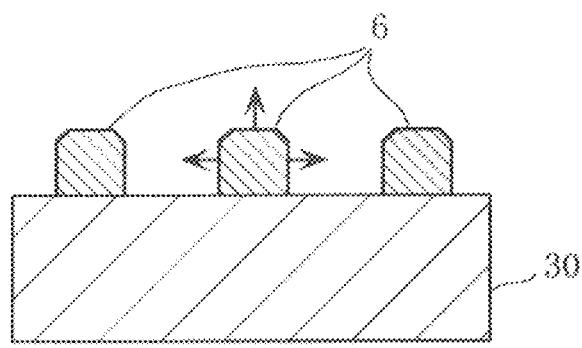
Figure 3C:
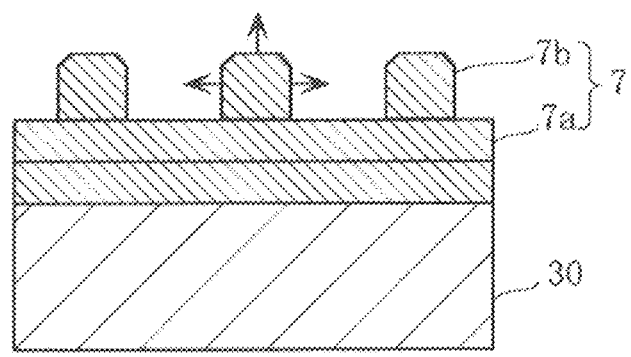

FIGS. 3(a) to 3(c) are diagrams schematically illustrating types of crystal growth modes in epitaxial growth.

The epitaxial growth differs in crystal growth mode depending on the difference in surface free energy between the thin film material and the substrate material, and in general, known are: the layered growth mode (Frank-van der Merwe mode) shown in FIG. 3(a); the island growth mode (Volmer-Weber mode) shown in FIG. 3(b); and the layered-island growth mode (Stranski-Krastanov mode) shown in FIG. 3(c).

In accordance with the layered growth mode (FIG. 3(a)), the process of forming a two-dimensional nucleus on the surface of a substrate 30, and causing the nucleus to grow to form, a monolayer in the form of a layer is repeated to achieve sequential growth of monolayers into a layered form, thereby forming a thin film 5. This layered growth mode is developed when the surface free energy of the substrate material is higher than the surface free energy of the thin film material, and can be observed in the case of homoepitaxial growth with homogeneity between the substrate material and the thin film material, or a low degree of lattice mismatch between the substrate material and the thin film material.

In contrast, in accordance with the island growth mode (FIG. 3(b)), atoms attached on a substrate 30 are, while diffusing on the substrate, bonded to form three-dimensional nuclei, and grow to three-dimensional islands with the nuclei as centers, thereby forming thin films 6. This island growth mode is developed when the surface free energy of the thin film material is higher than the surface free energy of the substrate material, and can be observed in the case of heteroepitaxial growth with a high degree of lattice mismatch between the substrate 30 and the thin films 6.

On the other hand, in accordance with the layered-island growth mode (FIG. 3(c)), first, two-dimensional nuclei are formed on the surface of a substrate 30, and the nuclei grow to form a layered film 7a of one or more layers of monolayers laminated. Then, on reaching a certain layer thickness, island films 7b are formed on the same principle as in FIG. 3(b), thereby providing a thin film 7 with the island films 7b formed on the layered film 7a. This layered-island growth mode can be observed when the degree of lattice mismatch and the difference in surface free energy between the substrate material and the thin film material have intermediate values between FIG. 3(a) and FIG. 3(b).

As just described, there is a close relationship between the crystal growth mode with epitaxial growth and the degree of lattice mismatch, and according to the present embodiment, the layered growth mode is believed to contribute to the formation of the matrix 2, whereas the island growth mode is believed to contribute to the formation of the pillars 1.

A method for calculating the degree of lattice mismatch will be described in detail below.

According to the present embodiment, the degree of lattice mismatch ΔL is calculated in accordance with the following formula (1).

$$\Delta L = ((L2-L1)/L1) \times 100 \qquad (1)$$

In this regard, L2 represents an interatomic distance of the thin film material, whereas L1 represents an interatomic distance of the substrate material.

More specifically, the degree of lattice mismatch is typically expressed by the ratio of the difference (a2−a1) between the lattice constant a2 of the thin film material and the lattice constant a1 of the substrate material to the lattice constant a1 of the substrate material, that is, (a2−a1)/a1.

However, in order to obtain a desired epitaxial film with the use of multiple materials that differ from the substrate material, there is a need to consider the orientation relationship of axes for junction planes between crystals. Further, to that end, there is a need to consider not only the lattice constants, but also, for example, rotate the crystal lattices of the substrate and thin film, thereby examining the symmetry, and examining the periodicity of the crystal lattices. More specifically, it is desirable to examine the match between the crystal lattices in consideration of the symmetry and periodicity of the crystal lattices, figure out such interatomic distances L1, L2 that reduce the degree of lattice mismatch, and theoretically calculate an appropriate degree of lattice mismatch ΔL on the basis of the interatomic distances L1, L2.

Table 1 shows the degree of lattice mismatch ΔL in the case of (0001) orientation on the substrate with the use of hexagonal ZnO (n-type semiconductor material) for the thin film material, and Table 2 shows the degree of lattice mismatch ΔL in the case of (111) orientation on the substrate with the use of cubic NiO (p-type semiconductor material) for the thin film material.

TABLE 1

| | Substrate | | | ZnO (0001) Orientation | | |
|---|---|---|---|---|---|---|
| Material (Lattice Plane) | Crystal System | Lattice Constant a1 (nm) | Interatomic Distance L1 (nm) | Lattice Constant a2 (nm) | Interatomic Distance L2 (nm) | Degree of Lattice Mismatch ΔL (%) |
| Al₂O₃(0001) | Hexagonal System | 0.475 | 0.475 | 0.32496 | 0.56285 (=√3 · a2) | 18.5 |
| LiNbO₃(0001) | Hexagonal System | 0.515 | 0.515 | 0.32496 | 0.56285 (=√3 · a2) | 9.3 |
| ScAlMgO₄(0001) | Hexagonal System | 0.3246 | 0.3246 | 0.32496 | 0.32496 | 0.1 |
| 6H—SiC(0001) | Hexagonal System | 0.308 | 0.308 | 0.32496 | 0.32496 | 5.5 |
| GaN(0001) | Hexagonal System | 0.318 | 0.318 | 0.32496 | 0.32496 | 2.2 |
| ZnO(0001) | Hexagonal System | 0.32496 | 0.32496 | 0.32496 | 0.32496 | 0 |
| LaTaO₃(0001) | Trigonal System | 0.5154 | 0.5154 | 0.32496 | 0.56285 (=√3 · a2) | 9.2 |
| SrTiO₃(111) | Cubic System | 0.391 | 0.553 (=√2 · a1) | 0.32496 | 0.56285 (=√3 · a2) | 1.8 |
| MgO(111) | Cubic System | 0.420 | 0.594 (=√2 · a1) | 0.32496 | 0.56285 (=√3 · a2) | −5.2 |

TABLE 2

| | Substrate | | | NiO (111) Orientation | | |
|---|---|---|---|---|---|---|
| Material (Lattice Plane) | Crystal System | Lattice Constant a1 (nm) | Interatomic Distance L1 (nm) | Lattice Comsistant a2 (nm) | Interatomic Distance L2 (nm) | Degree of Lattice Mismatch ΔL (%) |
| Al₂O₃ (0001) | Hexagonal System | 0.475 | 1.646 (=2√3 · a1) | 0.419 | 1.779 (=3√2 · a2) | 8.1 |
| LiNbO₃(0001) | Hexagonal System | 0.515 | 1.784 (=2√3 · a1) | 0.419 | 1.779 (=3√2 · a2) | −0.3 |
| ScAlMgO₃(0001) | Hexagonal System | 0.3246 | 0.562 (=√3 · a1) | 0.419 | 0.593 (=√2 · a2) | 5.5 |
| 6H—SiC(0001) | Hexagonal System | 0.308 | 0.533 (=√3 · a1) | 0.419 | 0.593 (=√2 · a2) | 11.3 |
| GaN (0001) | Hexagonal System | 0.318 | 0.551 (=√3 · a1) | 0.419 | 0.593 (=√2 · a2) | 7.6 |
| ZnO (0001) | Hexagonal System | 0.32496 | 0.563 (=√3 · a1) | 0.419 | 0.593 (=√2 · a2) | 5.4 |
| LaTaO₃ (0001) | Trigonal System | 0.5154 | 1.784 (=2√3 · a1) | 0.419 | 1.779 (=3√2 · a2) | −0.3 |
| SrTiO₃ (111) | Cubic System | 0.391 | 0.553 (=√2 · a1) | 0.419 | 0.593 (=√2 · a2) | 7.2 |
| MgO (111) | Cubic System | 0.420 | 0.594 (=√2 · a1) | 0.419 | 0.593 (=√2 · a2) | −0.2 |

For example, in the case of forming a ZnO (0001) oriented thin film on a hexagonal $Al_2O_3$ (0001) plane, the degree of lattice mismatch ΔL can be calculated in the following way.

Figure 4:
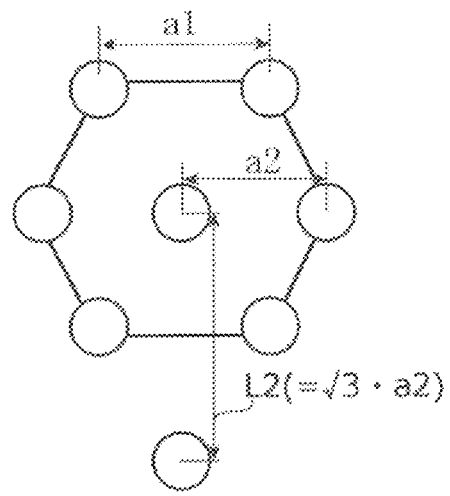
FIG. 4 is a plan view of a hexagonal crystal lattice for explaining the relationship between a lattice constant a2 and an interatomic distance L2 of a thin film material.

More specifically, FIG. 4 is a plan view illustrating a hexagonal crystal lattice, and in the figure, ○ indicates atom positions of the crystal lattice.

The lattice constant a1 of $Al_2O_3$ (0001) is 0.475 nm, whereas the lattice constant a2 of ZnO (0001) is 0.32496 nm, and thus, when the degree of lattice mismatch ΔL is calculated with the foregoing lattice constants as the interatomic distances L1, L2, the degree of lattice mismatch ΔL is −31.6% in accordance with the formula (1).

On the other hand, when the lattice constant a1 of the $Al_2O_3$ (0001) is regarded as the interatomic distance L1, whereas the interatomic spacing in the direction of rotating the c plane of ZnO by 30° is regarded as the interatomic distance L2 (=√3·a2) as shown in FIG. 4, the degree of lattice mismatch ΔL is 18.5% in accordance with the formula (1).

Therefore, when the interatomic spacing in the direction of rotating the c plane of ZnO by 30° is used as the interatomic distance L2, the degree of lattice mismatch ΔL is lower in terms of absolute value as compared with a case where the lattice constant a2 of ZnO is used, and a more appropriate degree of lattice mismatch ΔL is thus believed to be 18.5%.

Figure 5:
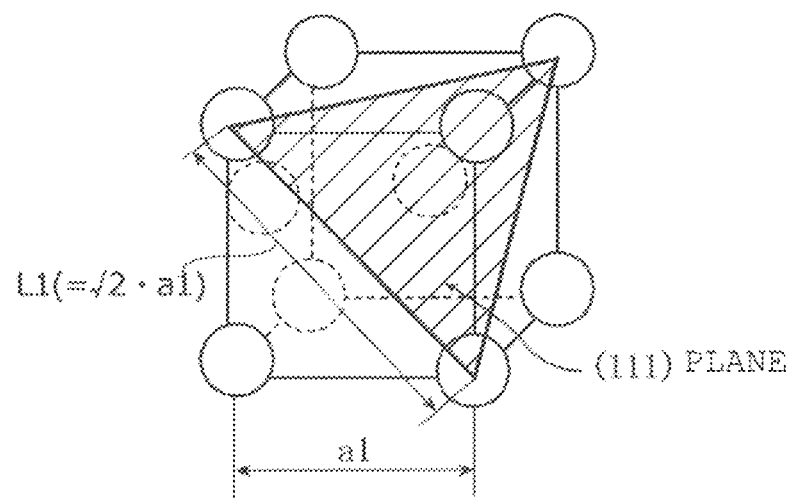
FIG. 5 is a perspective view of a cubic crystal lattice for explaining the relationship between a lattice constant a1 and an interatomic distance L1 of a substrate material.

FIG. 5 is a perspective view illustrating a cubic crystal lattice, and in the figure, ○ indicates atom positions of the crystal lattice.

In the case of forming a ZnO (0001) oriented thin film on a (111) plane of a cubic system such as $SrTiO_3$, the cubic (111) plane corresponds to a shaded area, and the nearest-neighbor interatomic distance L1 is √2·a1 in a direction tilted at 45° with respect to the lattice constant a1.

More specifically, in the case of a cubic system such as $SrTiO_3$, an appropriate degree of lattice mismatch ΔL can be calculated by the same method as described above, with the interatomic distance L1 as √2·*a1.

Further, as is clear from Table 1, in the case of forming a ZnO (0001) oriented thin film on the substrate 4, for $Al_2O_3$ (0001), $LiNbO_3$ (0001), $LaTiO_3$ (0001), $SrTiO_3$ (111), and MgO (111), the interatomic spacing of ZnO rotated by 30° in the c plane is regarded as the interatomic distance L2 (=√3·a2), and the interatomic distances L1, L2 are combined to reduce lattice mismatch, thereby making it possible to obtain degrees of lattice mismatch ΔL.

In addition, for $ScAlMgO_4$ (0001), 6H—SiC (0001), and GaN (0001), the lattice constants a1, a2 of the both substrate material and ZnO are respectively regarded as the interatomic distances L1, L2, thereby making it possible to obtain appropriate degrees of lattice mismatch ΔL.

In addition, as is clear from Table 2, in the case of forming a NiO (111) oriented thin film on the substrate 4, for $Al_2O_3$ (0001) and $LiNbO_3$ (0001), two periodic crystal lattices of the substrate material and three periodic crystal lattices of NiO are respectively regarded as the interatomic distances L1, L2, thereby providing favorable lattice match, and thus making it possible to calculate more appropriate lattice degrees of lattice mismatch ΔL.

Further, for example, when $ScAlMgO_4$, 6H—SiC, GaN, or $SrTiO_3$ is selected for the substrate material, the degree of lattice mismatch ΔL with ZnO is lower than the degree of lattice mismatch ΔL with NiO in terms of absolute value, thus making it possible to obtain the thin film 3 that has a phase-separated nanostructure where NiO as a p-type semi-conductor material forms the pillars 1, whereas ZnO as an n-type semiconductor material forms the matrix 2.

In addition, when $Al_2O_3$, $LiNbO_3$, $LaTaO_3$, or MgO is selected for the substrate material, the degree of lattice mismatch ΔL with ZnO is higher than the degree of lattice mismatch ΔL with NiO in terms of absolute value, thus making it possible to obtain the thin film 3 that has a phase-separated nanostructure where ZnO as an n-type semiconductor material forms the pillars 1, whereas NiO as a p-type semiconductor material forms the matrix 2.

Alternatively, when ZnO is selected for the substrate material, the matrix 2 of ZnO can be prepared by homoepitaxial growth, thus making it possible to obtain a matrix with more favorable crystallinity.

It is to be noted that while cases of using ZnO as an n-type semiconductor material and NiO as a p-type semiconductor material for thin film materials are given as examples in Tables 1 and 2, the degree of lattice mismatch ΔL can be also theoretically calculated in the same way when $TiO_2$, $Fe_3O_4$, $Fe_2O_3$, MnO, or an ITO is used as the n-type semiconductor material, or when $Cu_2O$, CuO, or CoO is used as the p-type semiconductor material, and an appropriate substrate material can be selected on the basis of the degree of lattice mismatch ΔL.

Whether the calculated degree of lattice mismatch ΔL is appropriate or not can be confirmed by, for example, applying an out-of-plane measurement (θ-2θ) or an in-plane measurement (φ scan, ($2θ_x$-φ) scan) to the prepared sample with the use of an X-ray diffraction method, or observing the sample with a transmission electron microscope (TEM) or the like, thereby examining the crystal structure or the orientation.

As just described, through the selection of the substrate material on the basis of the degree of lattice mismatch ΔL, and the setting of deposition conditions such as a substrate temperature and an oxygen concentration to appropriate conditions, the matrix 2 and the pillars 1 are formed respectively from one of the p-type semiconductor material and the n-type semiconductor material and the other semiconductor material, thereby making it possible to obtain a thin-film structural body including the thin film 3 that has a phase-separated nanostructure.

It is to be noted that the substrate 4 has only to contain therein, as its main constituent, the single crystal material given as examples in Tables 1 and 2, and preferably contains minute amounts of impurities, if necessary, because even containing minute amounts of impurities is not considered to affect the degree of lattice mismatch ΔL. For example, in order to apply the present thin-film structural body to a semiconductor device such as a solar cell, the substrate 4 needs to have electrical conductivity. Further, in order to ensure the electrical conductivity of the substrate 4, the single crystal material containing therein minute amounts of impurities such as Nb can be used for the substrate materials.

For the present thin-film structural body, it is preferable to form the thin film 3 on the substrate 4 with the use of a PLD (Pulse Laser Deposition) method, which makes it possible to prepare the thin film 3 by epitaxial growth through the use of self-organization in an efficient manner.

Figure 6:
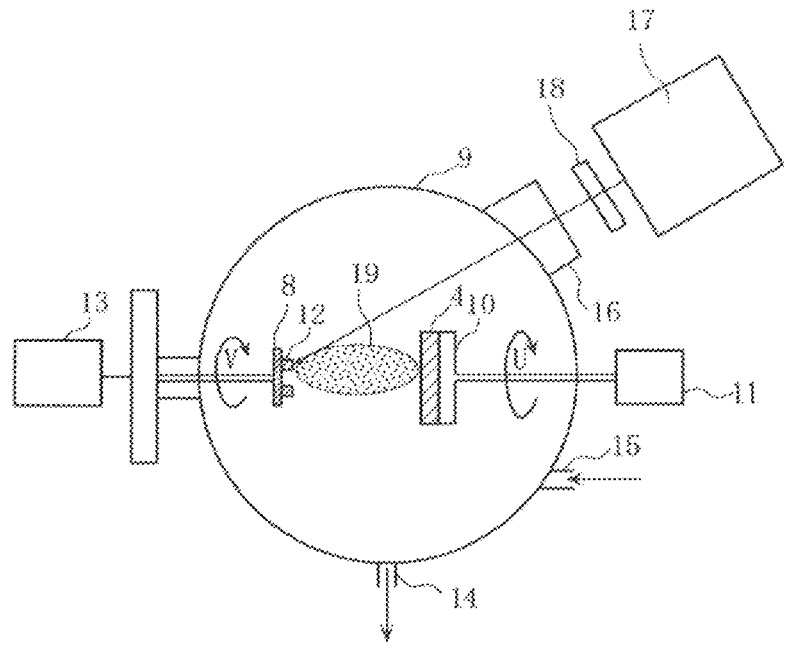
FIG. 6 is a conceptual diagram illustrating an embodiment of a PLD system.

FIG. 6 is a conceptual diagram schematically illustrating an embodiment of a PLD system.

This PLD system has a substrate 4 and a target holder 8 disposed to foe opposed in a deposition chamber 9.

The substrate 4 is held on a substrate holder 10 with a built-in heater, and supposed to be rotatable in the direction of an arrow U via a rotating machinery 11 connected to one end of the substrate holder 10.

The target holder 8 has a target substance 12 held on the surface, and has one end connected to a target rotating machinery 13 such that the target holder 8 is supposed to be rotatable in the direction of an arrow V.

In addition, the deposition chamber 9 is provided with an exhaust port 14 connected to a vacuum system such as a vacuum pump, an oxygen supply port 15 that supplies oxygen to the deposition chamber 9 such that the inside of the deposition chamber 9 reaches a predetermined oxygen concentration, and a laser introduction port 16 that guides laser light into the deposition chamber 9.

In addition, the outside of the deposition chamber 9 is provided with a laser oscillator 17 such as an excimer laser and a condensing lens 18, and laser light of a predetermined wavelength output from the laser oscillator 17 is configured to be supplied through the condensing lens 18 to the deposition chamber 9, and irradiate the target substance 12 on the surface of the target holder 8.

Further, the thin-film structural body can be manufactured in the following way.

First, the p-type semiconductor material and the n-type semiconductor material that are phase-separated, in a state of thermal equilibrium are prepared respectively. Whether the materials are phase-separated in a state of thermal equilibrium or not can be determined on the basis of a phase diagram that shows a state of thermal equilibrium, as described above, examples of the p-type semiconductor material include, for example, NiO, $Cu_2O$, CuO, and CoO, whereas examples of the n-type semiconductor material include, for example, ZnO, $Fe_3O_4$, $Fe_2O_3$, MnO, and an ITO, and the respective oxide semiconductor materials can be selected by combining the foregoing materials.

Then, the substrate material is selected. For the substrate material, a material can be selected which has a main constituent formed from, for example, the single crystal material in Table 1 or 2 above.

Next, as the target substance 12, a mixed sintered body of the p-type semiconductor material and the n-type semiconductor material is prepared, and held on the target holder 8. It is to be noted that the mixture ratio between the p-type semiconductor material and the n-type semiconductor material can be, depending on the degrees of difficulty in crystal growth of the two semiconductor materials, set so as to obtain a desired phase-separated nanostructure including pillars/matrix. For example, the materials can be used which meet p-type semiconductor material: n-type semiconductor material=50 to 5:50 to 95 in weight %.

Then, the substrate 4 is held on the substrate holder 10 to be opposed to the target holder 8, the pressure is reduced in the deposition chamber 9, and oxygen is supplied from the oxygen supply port 15 such that the deposition chamber 9 reaches a predetermined oxygen concentration.

Then, the substrate 4 is heated through the heater built in the substrate holder 10, the substrate holder 10 and the target holder 8 are respectively rotated in the directions of the arrows U and V, and laser light is output from the laser oscillator 17 to irradiate the target substance 12 with the laser light. Then, the target substance 12 absorbs the laser light on the target holder 8 to induce ablation for explosively emitting particles, and the particles 19 emitted by the ablation reaches a plasma state referred to as plume, and reaches the substrate 3 while colliding with an oxygen gas in the deposition chamber 9. Then, the mixed sintered body is phase-separated into the p-type semiconductor material and the n-type semiconductor material in a state of thermal equilibrium, and thus deposited as the phase-separated pillars 1 and matrix 2, and in the subsequent finishing step, the matrix material is laminated, thereby resulting in the plurality of pillars 1 coated with the matrix 2, and thus in the formation of, on the substrate 4, the thin film 3 that has a phase-separated nanostructure.

It is to be noted that the heating temperature for the substrate 4 and the oxygen concentration in the deposition chamber 3 are not to be considered particularly limited, but set depending on the degree of lattice mismatch $\Delta L$. For example, the oxygen concentration and the substrate temperature can be respectively set to 0.01 to 100 Pa in terms of partial pressure and 400 to 1000° C.

As just described, while the degree of lattice mismatch $\Delta L$ differs depending on the substrate material, the appropriate control of the oxygen concentration and substrate temperature in the deposition chamber 9 can achieve epitaxial growth through the use of desired self-organization, thereby providing a high-quality pillar/matrix thin-film structural body which has a large triaxially oriented area of contact, without generating defects or crystal grain boundaries in the thin film 3.

As described above, the present thin-film, structural body includes the thin film 3 that has a phase-separated nanostructure where the pillars 1 are dispersed in the matrix 2, the thin film 3 has the p-type semiconductor material and the n-type semiconductor material that are phase-separated in a state of thermal equilibrium, the matrix 2 is formed from any one of the p-type semiconductor material and the n-type semiconductor material, whereas the pillars 1 are formed from the other semiconductor material, and the thin film 3 is formed on the substrate 4 such that the pillars 1 and the matrix 2 have three-dimensional junction planes. Thus, as compared with two-dimensional laminated structures of p-type semiconductor layers and n-type semiconductor layers laminated, the area of contact at the junction interfaces of the p-n junctions can be increased, and a high-quality/ high-performance thin-film structural body can be achieved which is applicable to high-efficiency energy conversion devices and various types of high-sensitivity sensors. In addition, the p-type semiconductor material and the n-type semiconductor material are phase-separated in a state of thermal equilibrium, thus allowing stable performance to be maintained even during thermal loading, and allowing for the achievement of a highly reliable thin-film structural body.

In addition, the formation of the matrix material and the substrate material from materials containing the same main constituent allows for the formation of the matrix 2 by homoepitaxial growth, thereby making it possible to achieve a matrix phase with more favorable crystallinity.

In addition, in accordance with the manufacturing method mentioned above, the p-type semiconductor material and the n-type semiconductor material are prepared which are phase-separated in a state of thermal equilibrium, three-dimensional crystal growth is achieved while separating the p-type semiconductor material and the n-type semiconductor material each into monolayers by self-organization on a substrate, thereby forming a matrix phase from any one of the p-type semiconductor material and the n-type semiconductor material and forming columnar separate phases from the other semiconductor material, and thus preparing, on the substrate, a thin film that has a phase-separated nanostructure where the separate phases are dispersed in the matrix phase. Thus, a highly reliable high-capacity thin-film structural body can be manufactured which has a large area of contact at the junction interfaces of the p-n junctions, and thus allows stable performance to be maintained even during thermal loading.

In addition, the crystal growth is achieved by epitaxial growth, thereby making it possible to suppress the generation of defects and crystal grain boundaries in the thin film 3, and thus manufacture a high-quality thin-film structural body with functionality improved, which has a dense and highly oriented film of crystal grains triaxially oriented.

Furthermore, the deposition of, on the substrate 4, the thin film 3 through the three-dimensional crystal growth by the PLD method described above provides a high degree or freedom for setting deposition conditions such as the substrate temperature and the atmosphere in the deposition chamber 9, because the laser oscillator 17 to serve as a laser light source is disposed outside the deposition chamber 9. Furthermore, the adoption of the mixture as the target substance 12 can avoid an increase in manufacturing system size and an increase in number of deposition conditions, without the need to use multiple target substances, thereby manufacturing a thin-film structural body in a simple and inexpensive manner.

Figure 7:
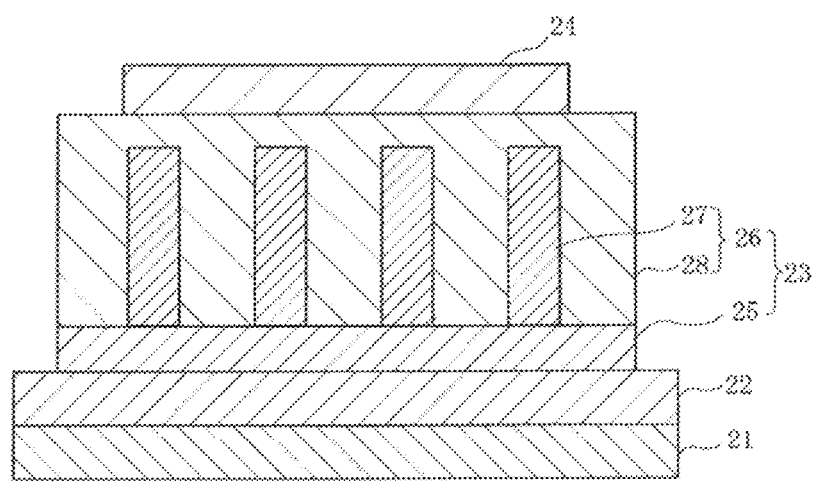
FIG. 7 is a cross-sectional view schematically illustrating an embodiment of a solar cell as a semiconductor device according to the present invention.

Next, a semiconductor device that uses the thin-film structural body mentioned above will be described in detail. FIG. 7 is a cross-sectional view illustrating an embodiment of a solar cell as a semiconductor device according to the present invention.

This solar cell has an anode 22 of Al or the like formed by a thin-film formation method such as a vacuum deposition method on the surface of a transparent substrate 21 such as a glass substrate, further has a thin-film structural body 23 formed as described above on the surface of the anode 22, and has a cathode 24 of a transparent conductive film such as an ITO formed on the surface of the thin-film structural body 23.

The thin film structural body 23 has a thin film 26 that has a phase-separated nanostructure, formed on the surface of a substrate 25. It is to be noted that the substrate 25 has a single crystal material such as $SrTiO_3$, containing therein minute amounts of impurities such as Nb, and the substrate 25 has electrical conductivity, for example, on the order of approximately $10^{31\ 3}$ Ω·cm in resistivity.

Further, the thin film 26 has a large number of columnar pillars 27 dispersed in a matrix 28, and the pillars 27 coated with the matrix 28 are formed on the substrate 25. It is to be noted, that according to this embodiment, the pillars 27 are formed from a p-type semiconductor material such as NiO, whereas the matrix 28 is formed from an n-type semiconductor material such as ZnO.

In the thus formed solar cell, when the junction interfaces (depletion layers) between the pillars 27 and the matrix 28 are irradiated with light, a large number of carriers (electron-hole pairs) is generated at the junction interfaces, and the electrons guided into an internal electric field are transported to the cathode 24 through the matrix 28 composed of the n-type semiconductor material. On the other hand, the holes are transported to the anode 22 through the pillars 27 composed of the p-type semiconductor material and the substrate 25, and thus, the electrons and the holes can be extracted to the outside, thereby converting light energy into electrical energy.

Further, the present solar cell has the thin-film structural body 23 described above, and thus has a large area of contact at the junction interfaces of the p-n junctions, thereby making it possible to generate carrier in large amounts, and furthermore, by virtue of the triaxial orientation, allowing for the achievement of a high-quality and highly reliable solar cell which has a favorable energy conversion efficiency from light energy into electrical energy.

It is to be noted that the present invention is not to be considered limited to the embodiments mentioned above. For example, while the embodiments mentioned above fail to make particular reference to the diameters of the pillars 1, ultrafine particles of 5 nm or less are more preferred, because a quantum size effect can be produced, thereby allowing for various types of control in a wide wavelength range.

In addition, while the embodiment mentioned above illustrates the solar cell as a semiconductor device, it is obvious that the invention is applicable to various types of semiconductor devices that use p-n junctions, and the invention is also applicable to, for example, LEDs and semiconductor lasers, and high-sensitivity sensors such as ultraviolet sensors, and gas sensors.

Next, an example of the present invention will foe described specifically.

EXAMPLE

[Preparation of Sample]

First, NiO and ZnO were selected respectively as the p-type semiconductor material and the n-type semiconductor material, and a mixed sintered body (target substance) of NiO:ZnO=3:7 in mixture ratio between NiO and ZnO was prepared.

Figure 8:
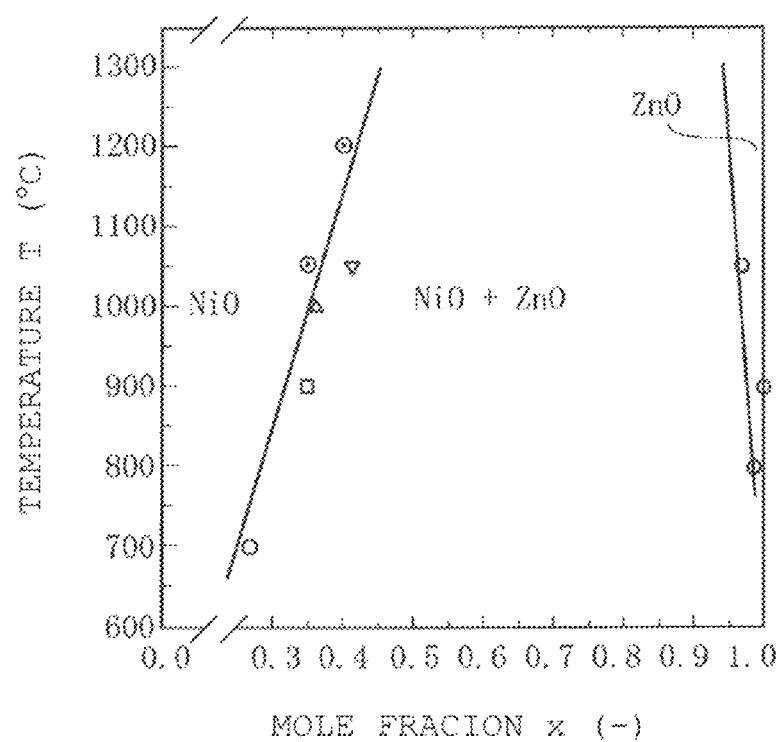
FIG. 8 is a thermal equilibrium diagram of NiO—ZnO.

FIG. 8 is a thermal equilibrium diagram of ZnO—NiO shown in Non-Patent Document 4. In FIG. 8, the horizontal axis indicates a ZnO mole fraction x (–), whereas the vertical axis indicates a temperature T (° C.).

As is clear from FIG. 8 herein, the NiO—ZnO is separated into two phases in a state of thermal equilibrium. More specifically, NiO is present in a region where the mole fraction of ZnO is low, whereas ZnO is present in a region where the mole fraction of ZnO is high, and in an intermediate region therebetween, no solid solution is formed, but ZnO and NiO are present as a mixture.

Non-Patent Document 4: D. S. Sinn, Solid State Ionic 83 (1595) 333

Next, for this mixed sintered body, an X-ray diffractometer (horizontal sample-type multipurpose X-ray diffractometer Ultima IV from Rigaku Corporation) was used to measure an X-ray diffraction spectrum (θ-2θ) with respect to incident X-ray (Characteristic X-ray: CuKα) for each sample.

Figure 9:
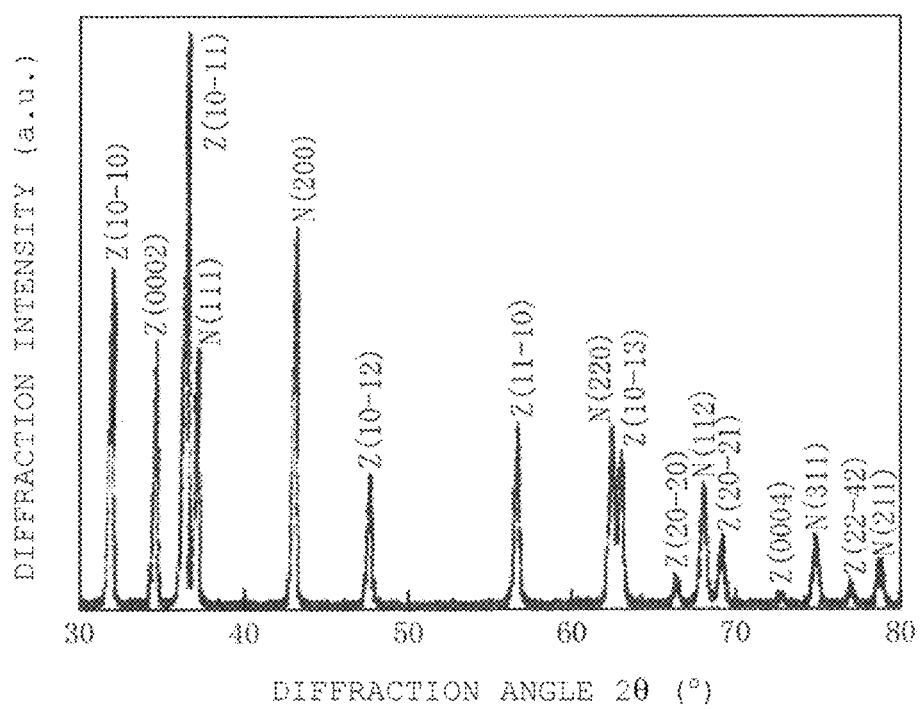
FIG. 9 shows an X-ray diffraction profile of a mixed sintered body for use in an example.

FIG. 9 is an X-ray diffraction profile of the mixed sintered body mentioned above. In the figure, the horizontal axis indicates a diffraction angle 2θ (°), whereas the vertical axis indicates X-ray intensity (a.u.). In addition, N and Z respectively indicate NiO peak intensity and ZnO peak intensity, and numerical values in brackets indicate plane indices of crystal lattices.

As is clear from FIG. 9 herein, the mixed sintered body of NiO and ZnO has peak intensity detected for each single phase of NiO or ZnO, and it has been thus confirmed that the mixed sintered body is present in a phase-separated state without producing any solid solution.

Next, a single crystal material of $SrTiO_3$ (hereinafter, referred to as "STO") was selected as a substrate. In regard to this STO, as listed in Tables 1 and 2, the degree of lattice mismatch ΔL is 1.8% with ZnO, whereas the degree of lattice mismatch ΔL is 7.2% with NiO. Accordingly, ZnO is expected to achieve crystal growth in a layered mode, whereas NiO is expected to achieve crystal growth in an island mode.

Next, a PLD system was prepared, and the STO substrate and the mixed sintered body as a target substance were disposed to be opposed in a deposition chamber. Then, in a condition in which the substrate temperature was heated with the deposition chamber brought into a reduced-pressure atmosphere with a predetermined oxygen partial pressure, the mixed sintered body was irradiated with laser light through a condensing lens by pulsed laser oscillation with an oscillation wavelength of 193 nm from an ArF excimer laser (laser oscillator), thereby depositing a thin film on the STO substrate. It is to be noted that as for the substrate temperature Tsub and the oxygen partial pressure $PO_2$, the substrate temperature Tsub and the oxygen partial pressure $PO_2$ were set respectively to 500 to 700° C. and 0.5 to 50 Pa, and the substrate temperature Tsub and the oxygen partial pressure $PO_2$ were combined to control the deposition conditions, thereby preparing respective samples of sample numbers 1 to 7.

[Evaluation of Sample]

Next, the samples mentioned above were evaluated for crystallinity and orientation with the use of the X-ray diffractometer described above.

More specifically, the X-ray diffractometer mentioned above has multiple rotation axes, the operation of the rotation axes can make not only out-of-plane measurements (θ-2θ), but also in-plane measurements (φ scan, ($2\theta_\chi$-φ) scan), and from the out-of-plane measurements and the in-plane measurements, the crystal structure and orientation of the samples can be evaluated with a high degree of accuracy.

Figure 10:
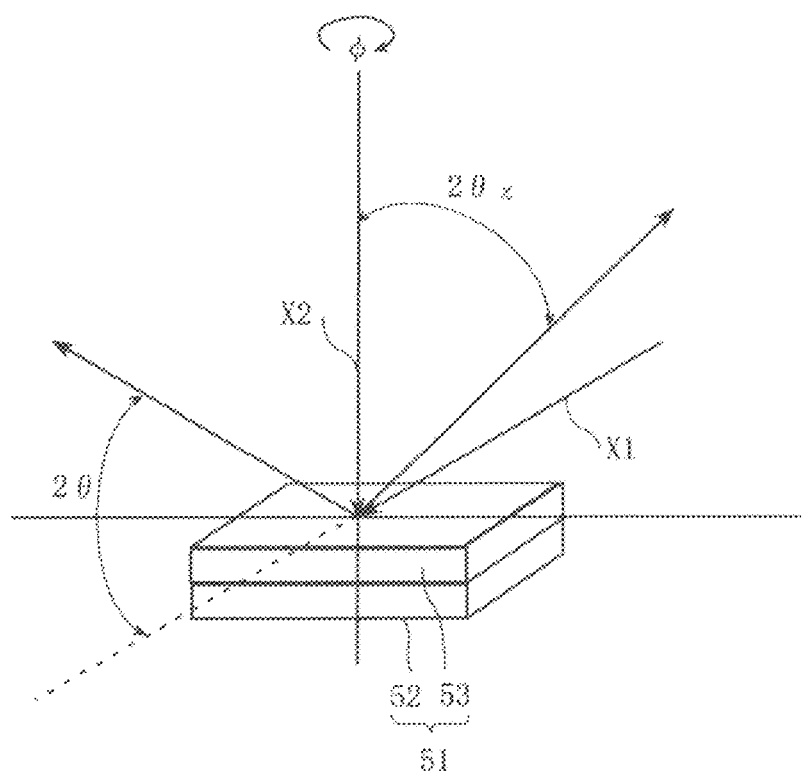
FIG. 10 is a diagram for explaining an out-of-plane measurement and an in-plane measurement in accordance with an X-ray diffraction method.

FIG. 10 shows the relationship among a diffraction angle 2θ, an in-plane rotation angle φ, an in-plane diffraction angle ($2\theta_\chi$-φ) to be measured by an X-ray diffraction method according to the present example.

For a sample 51, a thin film 53 that has a pillar (NiO)/matrix (ZnO) structure is formed on an STO substrate 52.

On irradiation with an incident X-ray (denoted by X1 in the figure) from a direction parallel to a lattice plane of the sample 51, the incident X-ray is diffracted in accordance with the Bragg formula (2d sin θ=nλ (d: thin film thickness, λ: wavelength, n: positive integer)), thereby making it possible to measure the X-ray intensity corresponding to the diffraction angle 2θ (out-of-plane measurement).

In addition, when the sample 51 is irradiated with an incident X-ray (denoted by X2 in the figure) from a direction normal to the lattice plane, while the sample 51 is rotated around a c axis, the in-plane crystal axis distribution at the surface of the sample 51 can be measured, and a rocking curve can be obtained which indicates X-ray intensity corresponding to the in-plane rotation angle φ (in-plane φ scan measurement).

Furthermore, X-ray intensity corresponding to the in-plane diffraction angle ($2\theta_\chi$-φ) can be obtained from the reflection angle obtained when the sample 51 is irradiated with an incident X-ray from a direction normal to the lattice plane (in-plane ($2\theta_\chi$-φ) scan measurement).

Therefore, first, for each sample of sample numbers 1 to 7, an out-of-plane measurement was made by irradiation with an incident X-ray from a direction parallel to the lattice plane, thereby providing an X-ray diffraction profile with respect to the diffraction angle 2θ.

FIGS. 11(a) to 11(g) show low-angle (diffraction angle 2θ: 32° to 42°) X-ray diffraction profiles for sample numbers 1 to 7, and FIGS. 12(a) to 12(g) show high-angle (diffraction angle 2θ: 70° to 90°) X-ray diffraction profiles therefor. The horizontal axes indicate diffraction angles 2θ (°), whereas the vertical axes indicate X-ray intensity (a.u.). In the figures, Z, N, and S respectively indicate peak intensity for ZnO, peak intensity for NiO, and peak intensity for the STO substrate.

Table 3 shows the relationship between the deposition condition and X-ray diffraction profile. For example, for sample number 1 under the deposition conditions of substrate temperature: 500° C. and oxygen partial pressure: 0.5 Pa, the low-angle X-ray diffraction profile and the high-angle X-ray diffraction profile are respectively shown in FIGS. 11(a) and 12(a).

TABLE 3

| | Deposition Condition | | X-Ray Diffraction Profile | |
| --- | --- | --- | --- | --- |
| | Substrate Temperature | Oxygen Partial | | |
| Sample No. | $T_{sub}$ (° C.) | Pressure $PO_2$ (Pa) | Low-Angle Side | High-Angle Side |
| 1 | 500 | 0.5 | FIG. 11 (a) | FIG. 12 (a) |
| 2 | 500 | 5.0 | FIG. 11 (b) | FIG. 12 (b) |
| 3 | 600 | 0.5 | FIG. 11 (c) | FIG. 12 (c) |
| 4 | 600 | 5.0 | FIG. 11 (d) | FIG. 12 (d) |
| 5 | 600 | 50 | FIG. 11 (e) | FIG. 12 (e) |
| 6 | 700 | 5.0 | FIG. 11 (f) | FIG. 12 (f) |
| 7 | 700 | 50 | FIG. 11 (g) | FIG. 12 (g) |

In FIGS. 11(a), 11(b), 11(d), 11(e), and 11(g), the peak intensity is detected at a diffraction angle 2θ around 34.5°. This peak intensity is, from FIG. 9, considered derived from ZnO (0002).

In addition, in FIGS. 11(a) to 11(g), the peak intensity is detected at a diffraction angle 2θ around 37°. This peak intensity is, from FIG. 9, considered derived from NiO (111).

Figure 12A:
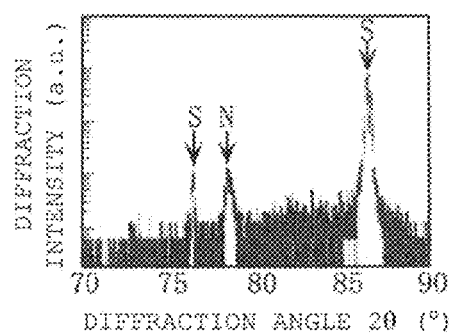
FIGS. 12(a) to 12(g) show high-angle X-ray diffraction profiles for each of the samples prepared according to the example.
Figure 12B:
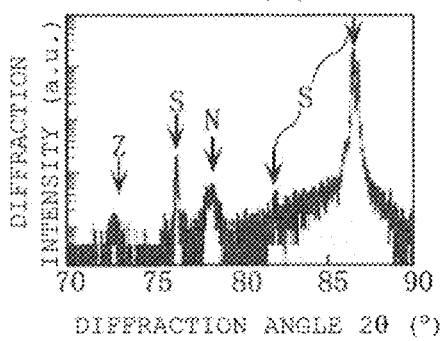
Figure 12C:
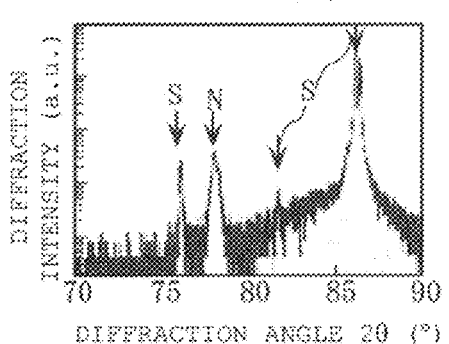
Figure 12D:
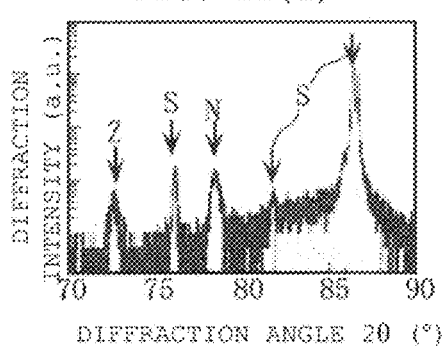
Figure 12E:
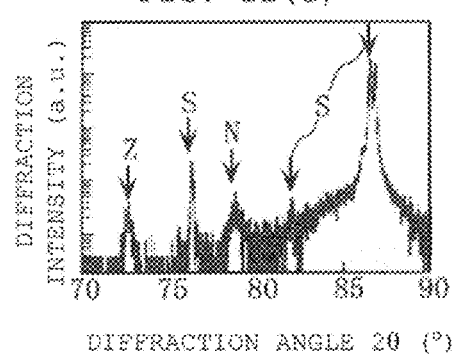
Figure 12F:
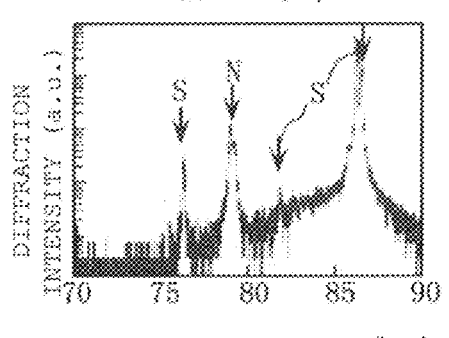
Figure 12G:
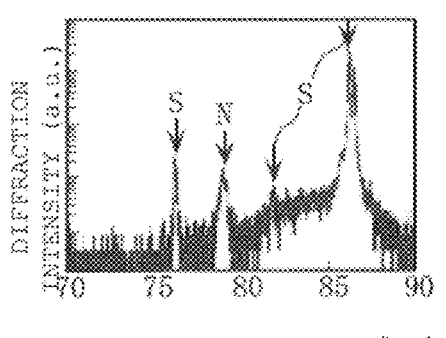

In addition, in FIGS. 12(b), 12(d), and 12(e), the peak intensity is detected at a diffraction angle 2θ around 73°. This peak intensity is, from FIG. 9, considered derived from ZnO (004).

In addition, in FIGS. 12(a) to 12(g), the peak intensity is detected at a diffraction angle 2θ around 78°. This peak intensity is, from FIG. 9, considered derived from NiO (211).

As just described, it is determined that the peak intensity for NiO is detected on both the low-angle and high-angle sides under all of the deposition conditions, and NiO is thus considered phase-separated from ZnO.

More specifically, it has been confirmed that ZnO and NiO phase-separated have a crystallographic orientation relationship of ZnO (0001)//NiO (111)//STO (111) in the c-axis direction perpendicular to the plane.

Further, from the X-ray diffraction profiles in FIGS. 11 and 12, it has been determined that appropriate setting of the deposition condition can detect peak intensity for both ZnO and NiO, and thus achieve a thin film that has a more favorable phase-separated nanostructure.

Next, for sample number 4, the X-ray diffractometer described above was used to measure a rocking curve. More specifically, the diffraction angle 2θ was fixed at the onset angle of the peak intensity position for ZnO, and the sample 51 was irradiated with an incident X-ray from a direction normal to the lattice plane, and rotated around the c axis to execute an in-plane φ scan, thereby measuring a rocking curve.

Figure 13:
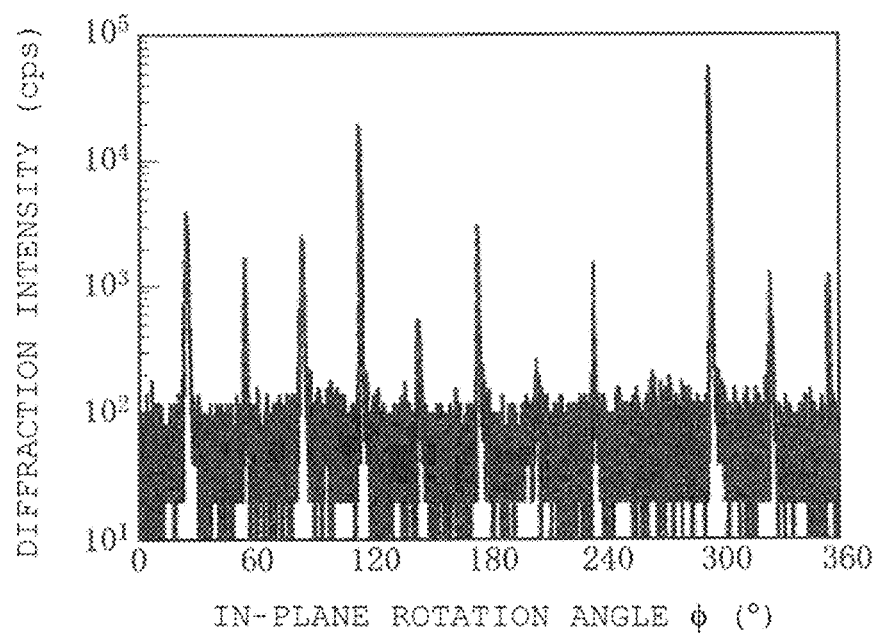
FIG. 13 shows a rocking curve profile obtained by in-plane measurement for sample number 4.

FIG. 13 shows the measurement result. In FIG. 13, the horizontal axis indicates an in-plane rotation angle φ (°), whereas the vertical angle indicates X-ray intensity (cps).

As is clear from FIG. 13 herein, it has been determined that for sample number 4, peak intensity is observed for every 30° of the in-plane rotation angle φ, which means that there is a rotational domain for every 30°. More specifically, the degree of lattice mismatch ΔL, calculated with the interatomic spacing in the direction of rotating ZnO by 30° as the interatomic distance L2, corresponds to the thin film prepared, and it has been confirmed that the calculated degree of lattice mismatch ΔL is appropriate.

Next, for sample number 4, an X-ray diffraction profile with respect to the in-plane diffraction angle ($2\theta_\chi$-φ) was measured by irradiation with an incident X-ray from a direction normal to the lattice plane of STO with the use of the X-ray diffractometer described above.

Figure 14:
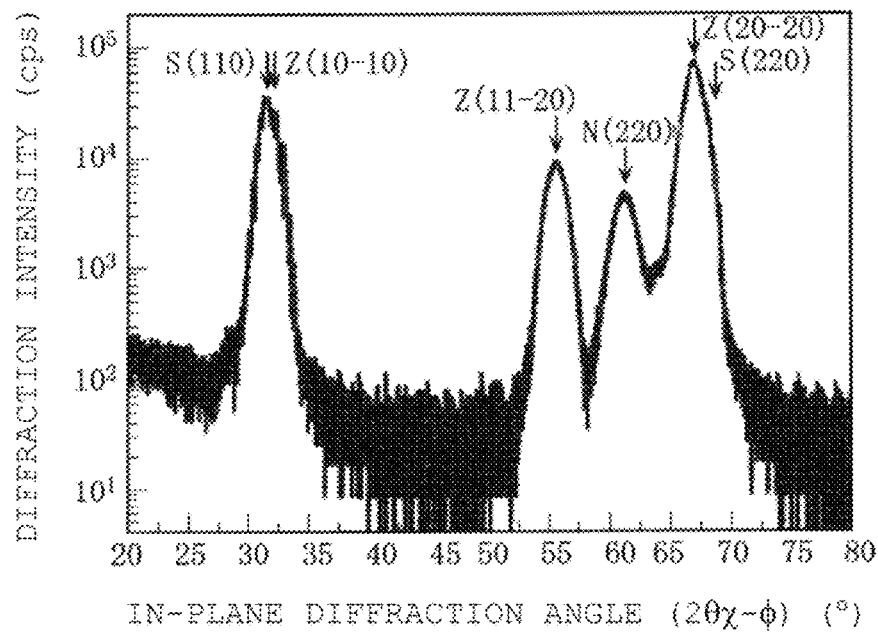
FIG. 14 shows an X-ray diffraction profile obtained by in-plane measurement for sample number 4.

FIG. 14 shows the measurement result. In FIG. 14, the horizontal axis indicates an in-plane diffraction angle ($2\theta_\chi$-φ) (°), whereas the vertical angle indicates X-ray intensity (cps).

As is clear from FIG. 14 herein, peak intensity is observed at the ZnO (10-10), ZnO (11-20), NiO (220), and ZnO (20-20), it has been thus confirmed that sample number 4 has an in-plane crystallographic orientation relationship of ZnO (10-10)//ZnO (11-20)//NiO (110)//STO (110).

From the foregoing, it has been confirmed that sample number 4 has a thin film obtained by triaxially oriented epitaxial growth in accordance with the following orientation relationship.

Perpendicular to Plane:
ZnO (0001)//N10(111)//STO(111)

In-Plane: ZnO(10-10)//ZnO(11-20)//NiO(110)7/STO(110)

Next, for sample number 4, a STEM image (bright-field image) was taken with the use of STEM-EDS (Scanning Transmission electron Microscope-Energy Dispersive X-ray Spectroscopy) system (JEM-2200FS-dry SD60GV detector from JEOL Ltd.), thereby performing a mapping analysis. It is to be noted that the measurement was made with a beam diameter of 2 nm after processing the sample by a FIB (Focus Ion Beam) pickup method.

FIGS. 15(a) to 15(d) show the measurement result of STEM-EDS for sample number 4, where FIGS. 15(a), 15(b), 15(c), and 15(d) respectively show an STEM image, a Zn mapping image, a Ni mapping image, and a diagram obtained by superimposing the STEM image, the Zn mapping image, and the Ni mapping image.

Figure 15A:
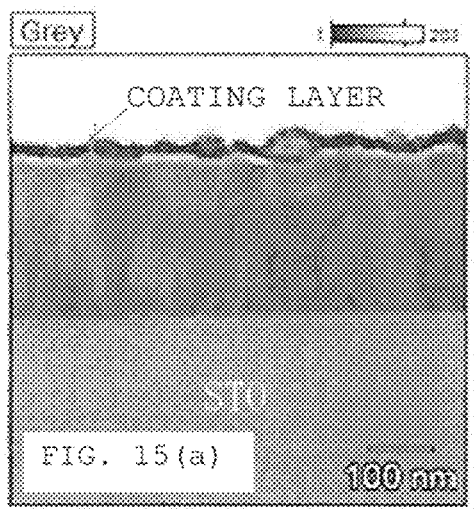
FIGS. 15(a) to 15(d) are diagrams showing measurement results of STEM-EDS for sample number 4.

As is clear from FIG. 15(a), it has been confirmed that a thin film of approximately 200 nm in film thickness on the order of 10 nm to 100 nm in grain size is formed on the STO substrate.

Figure 15B:
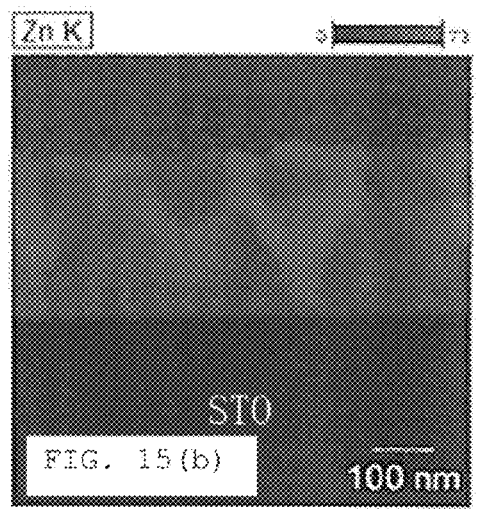
Figure 15C:
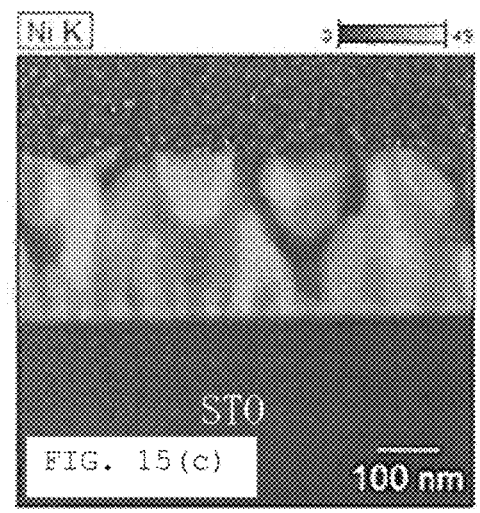
Figure 15D:
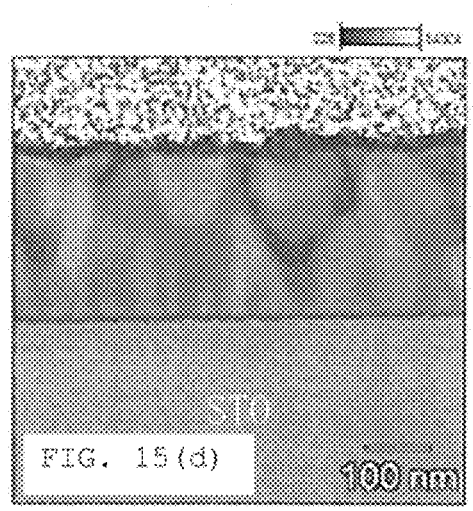

In addition, as can be seen from FIGS. 15(b) to 15(d), there is crystal growth such that the Zn region and Ni region are segmented distinctly, and it has been determined that ZnO and NiO are phase-separated.

Next, for sample number 5, the crystal structure was analyzed in detail with the use of a field-emission transmission electron microscope (JEM-2200FS from JEOL Ltd.) (hereinafter, referred to simply as a "TEM").

First, a TEM image (bright-field image) was taken under measurement conditions of acceleration voltage: 200 kV, minimum beam diameter: 0.5 nm in diameter, and resolution: 0.23 nm.

It is to be noted that the sample was subjected to FIB processing with the use of ion beams and a fine probe, into a thin section so as to have a thickness on the order of 10 nm in a direction vertical to a cross section to be observed, and subjected to measurements.

Figure 16:
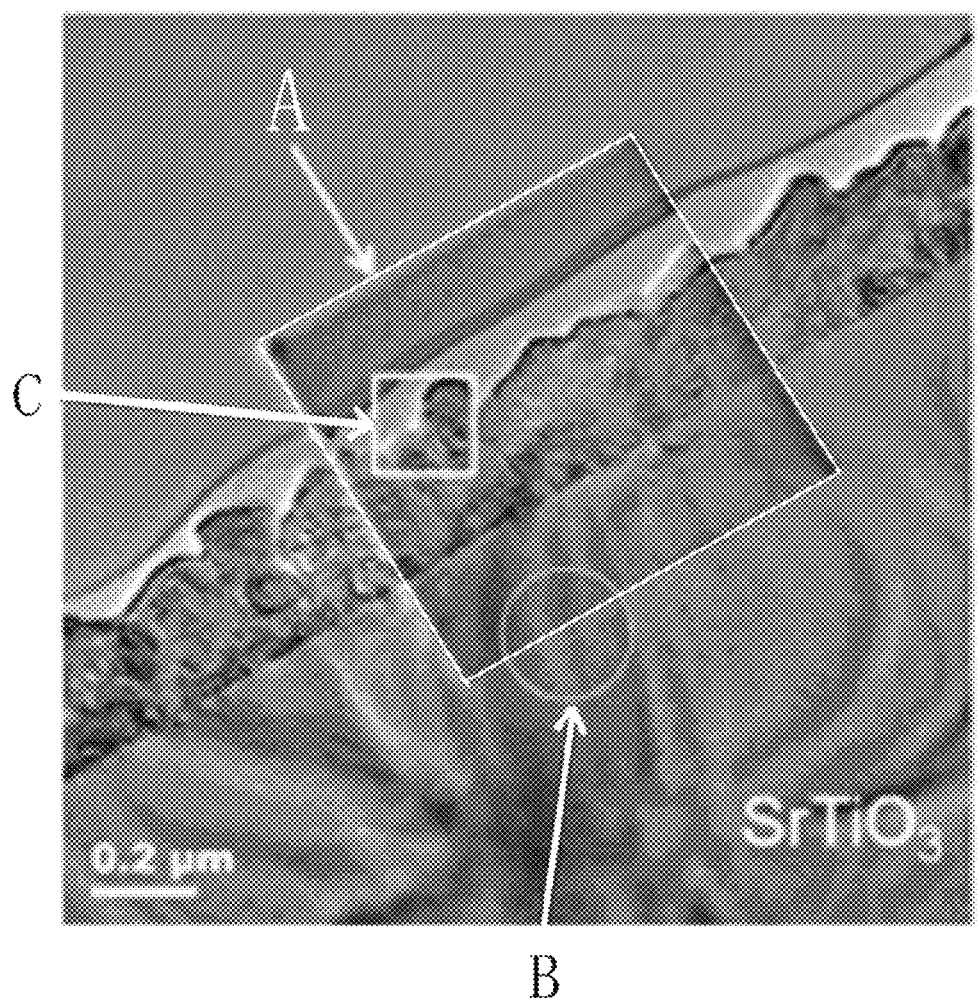
FIG. 16 shows a TEM image for sample number 5.

FIG. 16 shows a TEM image obtained by imaging of sample number 5 at 12000-fold magnification.

Then, in this TEM image, a part A was subjected to mapping analysis by an EDS method, thereby providing a Zn mapping image and a Ni mapping image.

FIG. 17(a) shows the TEM image of the part A, FIG. 17(b) shows a Zn mapping image of the part A, and FIG. 17(c) snows a Ni mapping image of the part A.

As is clear from the TEM image in FIG. 17(a), it has been confirmed that a thin film of approximately 200 nm in film thickness is formed on the STO substrate.

In addition, as can be seen from FIGS. 17(b) and 17(c), it has been determined that ZnO and NiO are phase-separated substantially as with sample number 4.

Next, electron beams are made incident onto a part B in FIG. 16 from the [110] orientation, thereby providing an electron diffraction image.

Figure 18:
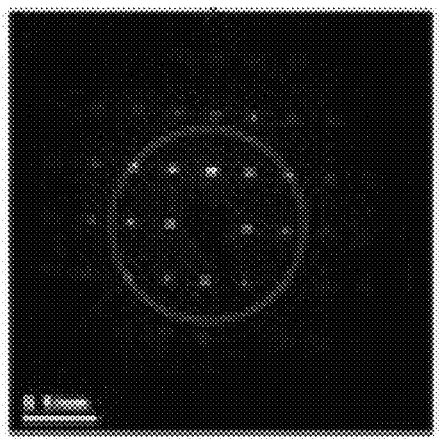
FIG. 18 shows an electron diffraction image of a part B in FIG. 16.

FIG. 18 shows the resale of the electron diffraction image of the part B.

From the diffraction pattern of the electron diffraction image, the incidence orientation of [110] onto the STO has been confirmed.

Next, for a part C in FIG. 16, the crystal structure was examined.

Figure 19:
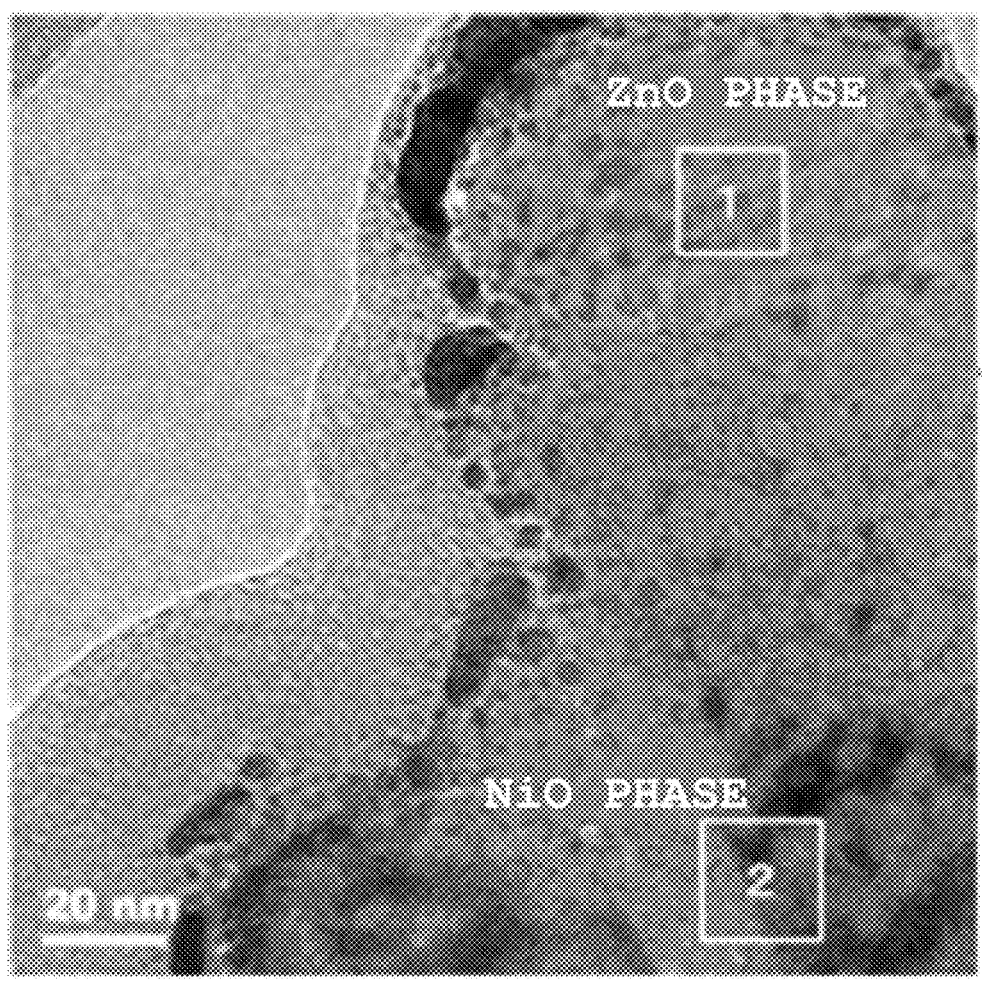
FIG. 19 shows a TEM image of a part C in FIG. 16.

FIG. 19 shows a TEM image obtained by imaging of the part C at 120000-fold magnification.

Then, for a region 1 and a region 2 in the part C in FIG. 19, the crystal structures were examined in further detail.

Figure 20:
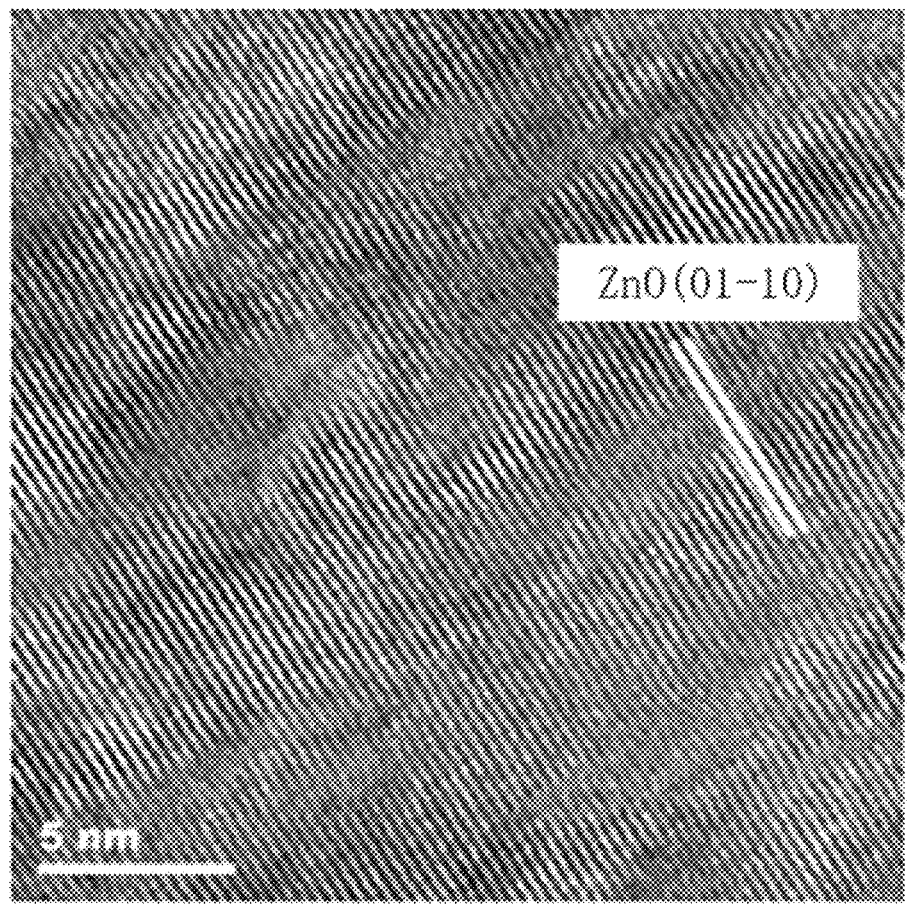
FIG. 20 shows a TEM image of a region 1 in FIG. 19.

FIG. 20 shows a TEM image obtained by imaging of the region 1 at 800000-fold magnification.

As is clear from FIG. 20 herein, clear lattice fringes are observed in a normal direction of the STO substrate, and it has been confirmed that the fringes are, from the lattice spacing, derived from ZnO (01-10). Thus, the epitaxial growth of ZnO (0001) parallel to the STO (111) substrate surface is believed to achieve epitaxial growth of a triaxially oriented ZnO film on the STO substrate.

Figure 21:
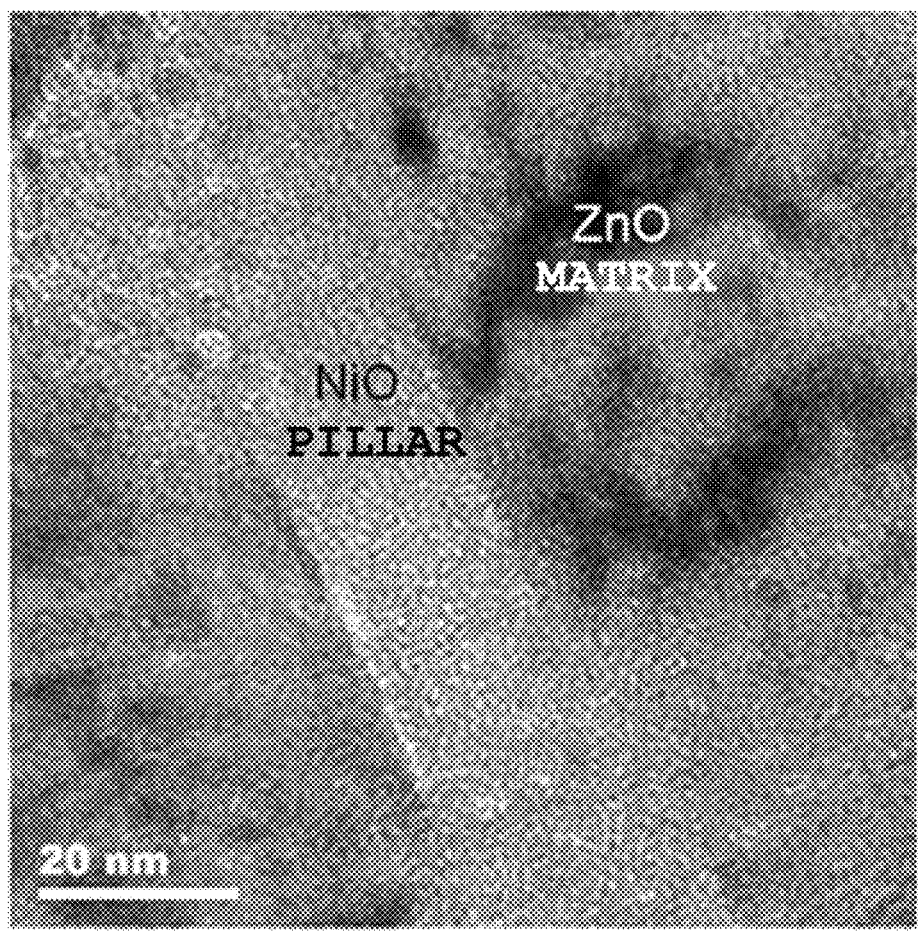
FIG. 21 shows a TEM image of a region 2 in FIG. 19.

FIG. 21 shows a TEM image obtained by imaging of the region 2 at 200000-fold magnification.

As is clear from FIG. 21 herein, an elongated columnar pillar of NiO on the order of 20 nm in diameter is formed in a matrix of ZnO, and it has been determined that NiO and ZnO are phase-separated.

Next, the junction interface between NiO and ZnO was observed at 800000-fold magnification.

Figure 22:
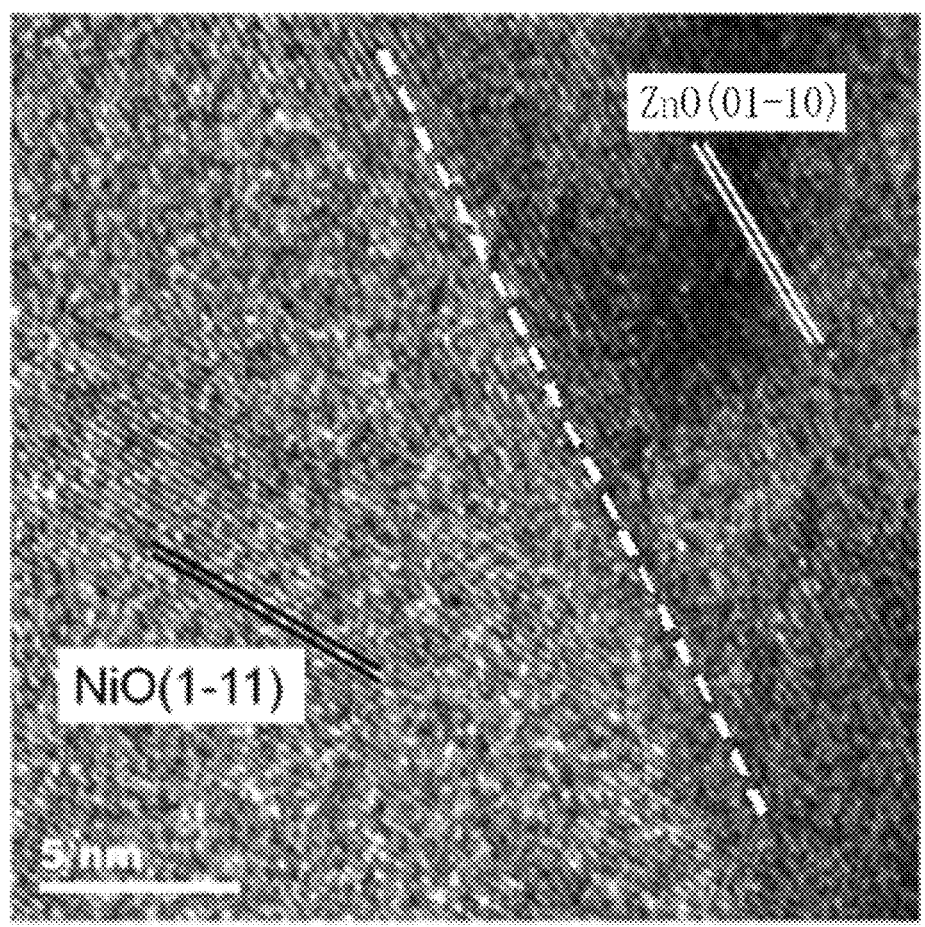
FIG. 22 shows an enlarged TEM image of FIG. 21.

FIG. 22 is a TEM image thereof.

NiO and ZnO are different in contrast, and the junction interface can be easily identified. In addition, lattice fringes can be confirmed for each of NiO and ZnO. It has been determined that the plane spacing's calculated from the lattice fringes and data obtained by Fourier transform of the image are derived from ZnO (01-10) and NiO (1-11). Considering that any alteration layer such as an amorphous layer is not found at the junction interface, and that ZnO and NiO are each a thin film triaxially oriented by epitaxial growth, a junction interface at the atomic level is believed to be formed.

Further, according to the example mentioned above, the distributions in the Zn region and the Ni region were checked for sample numbers 4 and 5, whereas the orientation was confirmed for sample number 5, but similar results were obtained for the other samples.

The high-quality thin-film structural body can be achieved which has a pillar/matrix phase-separated nanostructure, a large area of contact at the junction interfaces of p-n junctions, and high reliability even against thermal loading, and the thin-film structural body can be used to achieve high-efficiency solar cells which are high in energy conversion efficiency, and various types of sensors such as high-sensitivity ultraviolet sensors and gas sensors.

DESCRIPTION OF REFERENCE SYMBOLS

1: pillar (separate phase)
2: matrix (matrix phase)
3: thin film
4: Substrate
9: deposition chamber
12: target substance (mixture)
17; pulse oscillator (pulsed laser)

The invention claimed is:

1. A structural body comprising:
   a substrate; and
   a film having a phase-separated nanostructure on the substrate, wherein the phase-separated nanostructure includes a columnar shape phase dispersed in a matrix phase and that are phase-separated in a state of thermal equilibrium such that the columnar phase and the matrix phase have a three-dimensional junction plane, and
   wherein, when the matrix phase is a p-type semiconductor material, the columnar phase is an n-type semiconductor material, and when the matrix phase is the n-type semiconductor material, the columnar phase is the p-type semiconductor material.

2. The structural body according to claim 1, wherein the substrate comprises a material having a degree of lattice mismatch with the p-type semiconductor material and the n-type semiconductor material.

3. The structural body according to claim 1, wherein the film is an epitaxially grown film.

4. The structural body according to claim 1, wherein crystal grains of the film are triaxially oriented.

5. The structural body according to claim 1, wherein the film is a pulsed laser deposited film.

6. The structural body according to claim 1, wherein the p-type semiconductor material comprises an oxide containing, as its main constituent, any one selected from the group of NiO, $Cu_2O$, CuO, and CoO.

7. The structural body according to claim 6, wherein the n-type semiconductor material comprises an oxide containing, as its main constituent, any one selected from the group of ZnO, $TiO_2$, $Fe_3O_4$, $Fe_2O3$, MnO, and an indium, tin oxide.

8. The structural body according to claim 7, wherein the substrate is formed from a single crystal material containing, as its main constituent, any one selected from the group of $SrTiO_3$, ZnO, MgO, $ScAlMgO_3$, $Al_2O_3$, GaN, $LiNbO_3$, and $LiTaO_3$.

9. The structural body according to claim 1, wherein the n-type semiconductor material comprises an oxide containing, as its main constituent, any one selected from the group of ZnO, $TiO_2$, $Fe_3O_4$, $Fe_2O3$, MnO, and an indium tin oxide.

10. The structural body according to claim 9, wherein the substrate is formed from a single crystal material containing, as its main constituent, any one selected from the group of $SrTiO_3$, ZnO, MgO, $ScAlMgO_3$, $Al_2O_3$, GaN, $LiNbO_3$, and $LiTaO_3$.

11. The structural body according to claim 1, wherein the substrate is formed from a single crystal material containing, as its main constituent, any one selected from the group of $SrTiO_3$, ZnO, MgO, $ScAlMgO_3$, $Al_2O_3$, GaN, $LiNbO_3$, and $LiTaO_3$.

12. The structural body according to claim 1, wherein a first material of the matrix phase and a second material of the substrate contain different respective main constituents.

13. The structural body according to claim 1, wherein a first material of the matrix phase and a second material of the substrate contain a same main constituent.

14. A method for manufacturing a structural body, the method comprising:
   preparing a p-type semiconductor material and an n-type semiconductor material that are phase-separated in a state of thermal equilibrium; and
   forming a film having a phase-separated nanostructure on a substrate by three-dimensional crystal growth while separating the p-type semiconductor material and the n-type semiconductor material each into monolayers by self-organization on the substrate so as to form a matrix phase from any one of the p-type semiconductor material and the n-type semiconductor material and a separate columnar shaped phase from the other of the p-type semiconductor material and the n-type semiconductor material and the separate columnar shaped phase is dispersed in the matrix phase.

15. The method for manufacturing a structural body according to claim 14, wherein the crystal growth is carried out by epitaxial growth.

16. The method for manufacturing a structural body according to claim 14, wherein a mixture of the p-type semiconductor material and the n-type semiconductor material is disposed as a target substance opposed to the substrate in a deposition chamber, and
   the film is formed on the substrate by heating the substrate and inducing ablation through irradiation of the mixture with a pulsed laser from an outside of the deposition chamber and under a reduced-pressure atmosphere.

17. The method for manufacturing a structural body according to claim 15, wherein the epitaxial growth comprises heteroepitaxial growth.

18. The method for manufacturing a structural body according to claim 15, wherein the epitaxial growth comprises homoepitaxial growth for the matrix phase, and heteroepitaxial growth for the separate columnar shaped phase.

19. A semiconductor device comprising:
   an electrically conductive substrate having a first surface and a second surface opposite the first surface;
   a film having a phase-separated nanostructure on the first surface of the electrically conductive substrate;
   an anode on the second surface of the electrically conductive substrate; and
   a cathode on the film having the phase-separated nanostructure,
   wherein the phase-separated nanostructure includes a columnar shaped phase dispersed in a matrix phase and that are phase-separated in a state of thermal equilibrium such that the columnar shaped phase and the matrix phase have a three-dimensional junction plane, and
   wherein, when the matrix phase is a p-type semiconductor material, the columnar shaped phase is an n-type semiconductor material, and when the matrix phase is the n-type semiconductor material, the columnar shaped phase is the p-type semiconductor material.

20. The semiconductor device according to claim 19, wherein crystal grains of the film are triaxially oriented.

* * * * *